US012316339B2

(12) United States Patent
Prasad et al.

(10) Patent No.: US 12,316,339 B2
(45) Date of Patent: May 27, 2025

(54) INPUT-ADAPTIVE ANALOG-TO-DIGITAL CONVERSION

(71) Applicant: QUALCOMM Incorporated, San Diego, CA (US)

(72) Inventors: Shashank Rajendra Prasad, Austin, TX (US); Xiaopeng Zhong, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 209 days.

(21) Appl. No.: 18/190,033

(22) Filed: Mar. 24, 2023

(65) Prior Publication Data

US 2024/0322837 A1  Sep. 26, 2024

(51) Int. Cl.
*H03M 1/46* (2006.01)
*H03M 1/14* (2006.01)

(52) U.S. Cl.
CPC ............. *H03M 1/466* (2013.01); *H03M 1/14* (2013.01); *H03M 1/468* (2013.01)

(58) Field of Classification Search
CPC ......... H03M 1/466; H03M 1/14; H03M 1/468
See application file for complete search history.

(56) References Cited

U.S. PATENT DOCUMENTS

| | | | |
|---|---|---|---|
| 7,982,652 B2 | 7/2011 | Simony et al. | |
| 9,106,246 B2 * | 8/2015 | Yang | ........................ H03M 1/38 |
| 9,716,512 B2 | 7/2017 | Field | |
| 10,211,844 B1 | 2/2019 | Molev-Shteiman et al. | |
| 10,436,882 B2 | 10/2019 | Meng et al. | |
| 10,469,095 B2 | 11/2019 | Lin et al. | |
| 11,190,201 B2 * | 11/2021 | Ho | ....................... H03M 1/1033 |

OTHER PUBLICATIONS

Chung Y-H., et al., "A 12-bit 40-MS/s SAR ADC With a Fast-Binary-Window DAC Switching Scheme", IEEE TRansactions on Very Large Scale Integration (VLSI) Systems, vol. 26, No. 10, Oct. 2018, pp. 1989-1998, Jul. 3, 2018, XP093166259, Piscataway, NJ, USA, section III.A, figures 5,6.
Chung Y-H., et al., "A 12-bit SAR ADC With a DAC-Configurable Window Switching Scheme", IEEE Transactions on Circuits and Systems I: Regular Papers, IEEE, US, vol. 67, No. 2, Feb. 2020, pp. 358-368, Jul. 4, 2019, XP011769300, section IV.A, figures 9,10,13.
International Search Report and Written Opinion—PCT/US2024/014496—ISA/EPO—May 6, 2024.

(Continued)

*Primary Examiner* — Khai M Nguyen
(74) *Attorney, Agent, or Firm* — Loza & Loza, LLP

(57) ABSTRACT

Aspects of the present disclosure provide input-adaptive analog-to-digital conversion in which the number of conversion cycles used to convert an input signal into a digital signal is adapted based on the level (i.e., amplitude) of the input voltage. In certain aspects, the input voltage is compared with one or more threshold voltages, and the number of conversion cycles is determined based on the comparison. In certain aspects, a most significant bit (MSB) capacitor in a capacitive digital-to-analog (DAC) is split into two or more capacitors to provide the one or more threshold voltages.

38 Claims, 16 Drawing Sheets

(56) References Cited

OTHER PUBLICATIONS

Shen Y., et al., An Energy-Efficient SAR ADC With a Coarse-Fine Bypass Window Technique, IEEE Transactions on circuits and systems I: Regular Papers, IEEE, US, vol. 70, No. 1, Jan. 2023, pp. 166-175, XP011932936, Oct. 10, 2022, section III.D, figures 3,5,7.
Sheu M-L., et al., "A Low Voltage Low Power 10-bit Successive Approximation ADC for Remote Geriatric Care Applications", Dec. 1, 2012, 19 Pages, XP093166397, p. 4, lines 1-10, figures 3a, 3b.

* cited by examiner

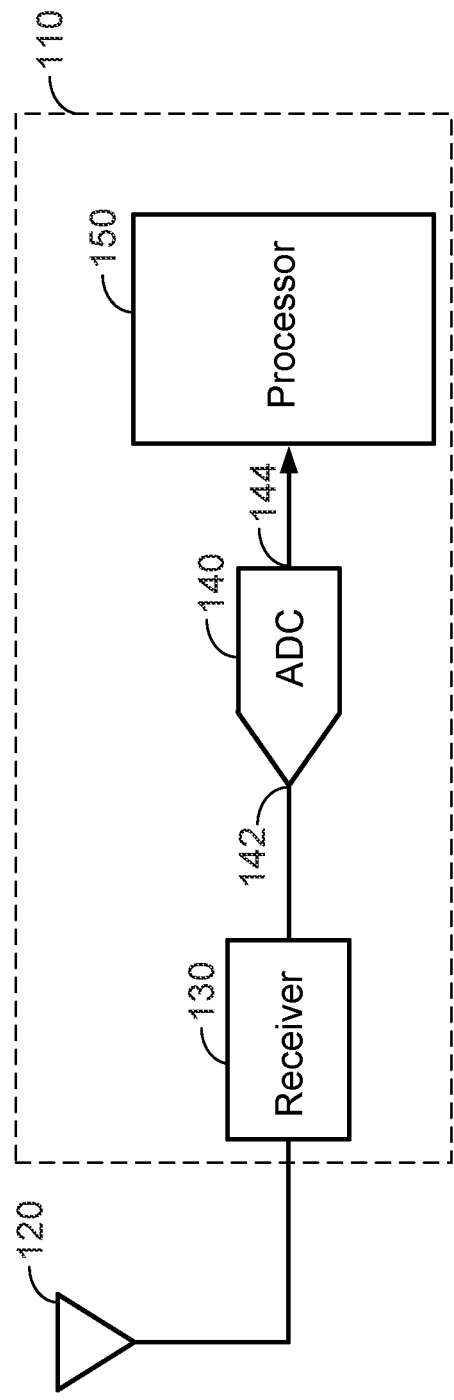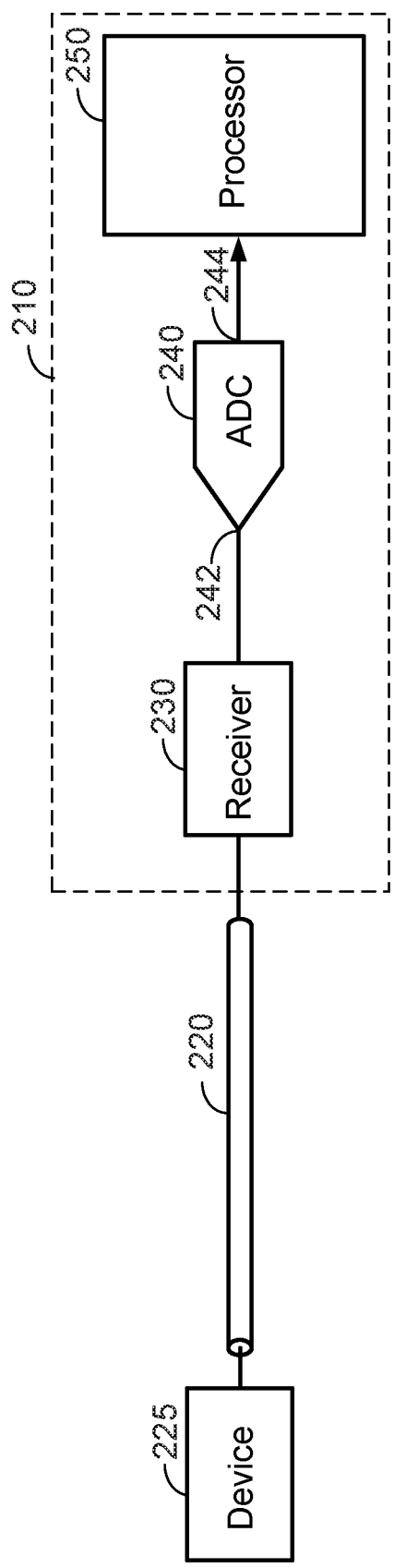

INPUT-ADAPTIVE ANALOG-TO-DIGITAL CONVERSION

BACKGROUND

Field

Aspects of the present disclosure relate generally to analog-to-digital conversion, and more particularly, to analog-to-digital converters (ADCs).

Background

An analog-to-digital converter (ADC) is used to convert an analog signal into a digital signal. One type of ADC is the successive approximation register (SAR) ADC, which converts an analog input signal into a digital signal using successive digital approximation. SAR ADCs have become popular for implementing low-power ADCs in advanced technologies.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an analog-to-digital converter (ADC). The ADC includes a comparator having a first input, a second input, and an output, wherein the second input of the comparator is coupled to a first voltage. The ADC also includes a successive approximation register (SAR) coupled to the output of the comparator, and a capacitive digital-to-analog converter (DAC) having an input and an output, wherein the input of the capacitor DAC is configured to receive an input voltage, and the output of the capacitive DAC is coupled to the first input of the comparator. The capacitive DAC includes binary-weighted capacitors, wherein the binary-weighted capacitors include a most significant bit (MSB) capacitor and lower-order capacitors, the MSB capacitor has a largest capacitance among the binary-weighted capacitors, the MSB capacitor comprises a first capacitor and a second capacitor, a first terminal of the first capacitor is coupled to the output of the capacitive DAC, a first terminal of the second capacitor is coupled to the output of the capacitive DAC, and a first terminal of each of the lower-order capacitors is coupled to the output of the capacitive DAC. The capacitive DAC also includes a switching circuit coupled to the SAR, to a second terminal of the first capacitor, to a second terminal of the second capacitor, and to a second terminal of each of the lower-order capacitors.

A second aspect relates to an analog-to-digital converter (ADC). The ADC includes a comparator having a first input, a second input, and an output. The ADC also includes a successive approximation register (SAR) coupled to the output of the comparator, and a first capacitive digital-to-analog converter (DAC) having an input and an output, wherein the input of the first capacitor DAC is configured to receive a first input voltage, and the output of the first capacitive DAC is coupled to the first input of the comparator. The first capacitive DAC includes first binary-weighted capacitors, wherein the first binary-weighted capacitors include a first most significant bit (MSB) capacitor and first lower-order capacitors, the first MSB capacitor has a largest capacitance among the first binary-weighted capacitors, the first MSB capacitor comprises a first capacitor and a second capacitor, a first terminal of the first capacitor is coupled to the output of the first capacitive DAC, a first terminal of the second capacitor is coupled to the output of the first capacitive DAC, and a first terminal of each of the first lower-order capacitors is coupled to the output of the first capacitive DAC. The first capacitive DAC also includes a first switching circuit coupled to the SAR, to a second terminal of the first capacitor, to a second terminal of the second capacitor, and to a second terminal of each of the first lower-order capacitors. The ADC also includes a second DAC having an input and an output, wherein the input of the second capacitor DAC is configured to receive a second input voltage, and the output of the second capacitive DAC is coupled to the second input of the comparator. The second capacitive DAC includes second binary-weighted capacitors, wherein the second binary-weighted capacitors include a second MSB capacitor and second lower-order capacitors, the second MSB capacitor has a largest capacitance among the second binary-weighted capacitors, the second MSB capacitor comprises a third capacitor and a fourth capacitor, a first terminal of the third capacitor is coupled to the output of the second capacitive DAC, a first terminal of the fourth capacitor is coupled to the output of the second capacitive DAC, and a first terminal of each of the second lower-order capacitors is coupled to the output of the second capacitive DAC. The second capacitive DAC also includes a second switching circuit coupled to the SAR, to a second terminal of the third capacitor, to a second terminal of the fourth capacitor, and to a second terminal of each of the second lower-order capacitors.

BRIEF DESCRIPTION OF THE DRAWINGS

FIG. 1 shows an example of a system including an ADC according to certain aspects of the present disclosure.

FIG. 2 shows another example of a system including an ADC according to certain aspects of the present disclosure.

DETAILED DESCRIPTION

Figure 3:
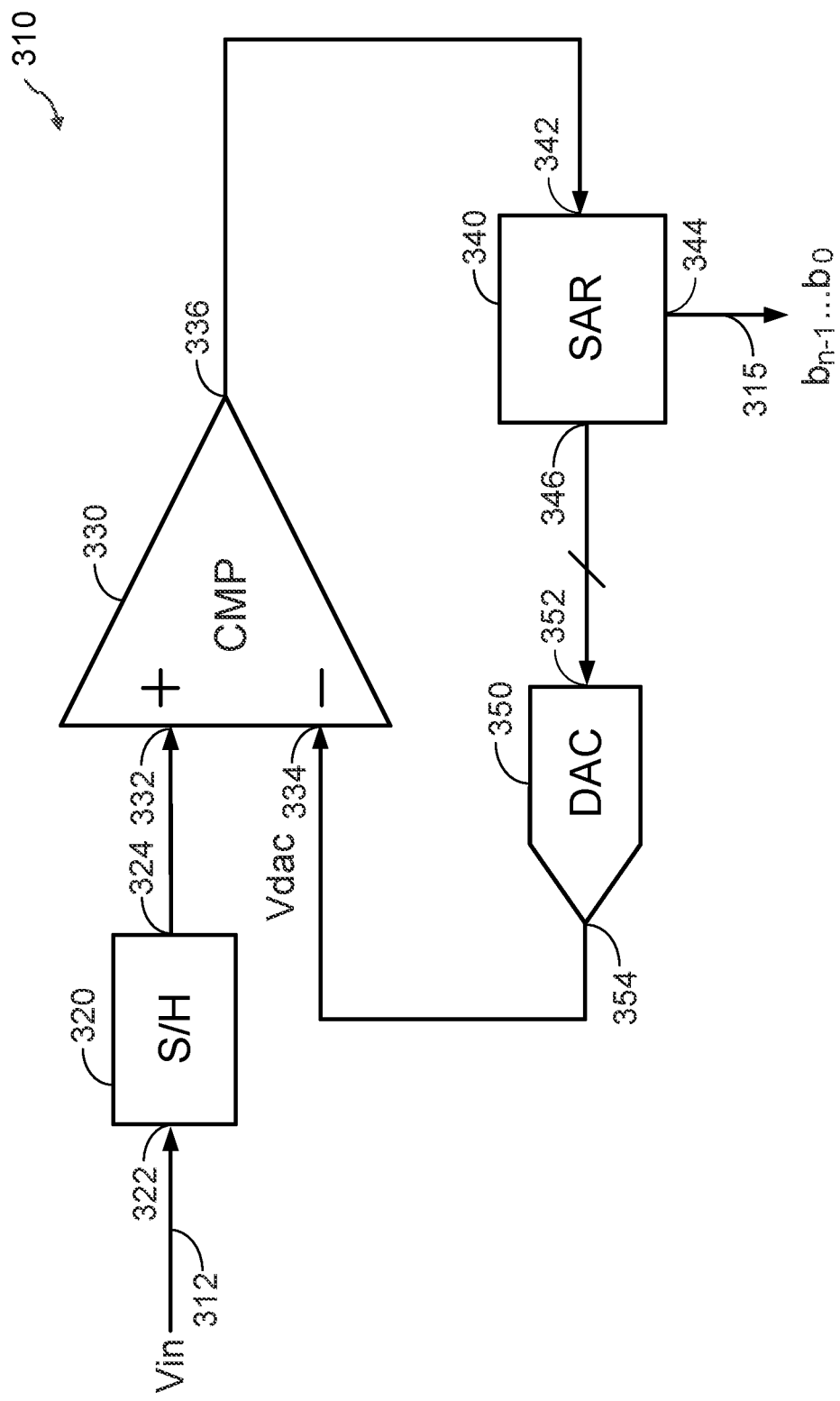
FIG. 3 shows an example of a SAR ADC according to certain aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

An ADC may be used in a system to convert an analog signal into a digital signal. For example, FIG. 1 shows an example of a system 110 in which an ADC 140 may be used according to certain aspects. In this example, the ADC 140 is configured to convert an analog signal at an input 142 of the ADC 140 into a digital signal at an output 144 of the ADC 140. The system 110 also includes a receiver 130 coupled to the input 142 of the ADC 140, and a processor 150 coupled to the output 144 of the ADC 140. In this example, the system 110 may be part of a wireless communication device (e.g., a handset).

The receiver 130 may be coupled to one or more antennas 120, and may be configured to receive a radio frequency (RF) signal via the one or more antennas 120. For example, the RF signal may be transmitted from a base station, an access point, or another wireless communication device. The receiver 130 may be configured to process the received RF signal into an analog baseband signal, and output the analog baseband signal to the ADC 140 for conversion into a digital signal. Processing performed by the receiver 130 may include frequency down-conversion, filtering, amplification, etc. The ADC 140 converts the analog baseband signal into a digital signal, and outputs the digital signal to the processor 150. The processor 150 may process the digital signal to recover data from the digital signal and process the recovered data. Processing performed by the processor 150 may include demodulation, decoding, etc. The processor 150 may include a processor core, a digital signal processor (DSP), an application specific integrated circuit (ASIC), a field programmable gate array (FPGA) or other programmable logic device, or any combination thereof.

FIG. 2 shows another example of a system 210 in which an ADC 240 may be used according to certain aspects. In this example, the ADC 240 is configured to convert an analog signal at an input 242 of the ADC 240 into a digital signal at an output 244 of the ADC 240. The system 210 also includes a receiver 230 coupled to the input 242 of the ADC 240, and a processor 250 coupled to the output 244 of the ADC 240.

In this example, the receiver 230 may be coupled to a wired channel 220, and may be configured to receive an analog signal via the wired channel 220. The wired channel 220 (also referred to as a wired link) may include one or more metal traces, one or more metal wires, a cable, an optical fiber, or any combination thereof. In this example, the wired channel 220 may be used to provide communication between a device 225 and the processor 250, in which a transmit driver (not shown) in the device 225 transmits the analog signal to the receiver 230 over the wired channel 220. The device 225 may include a peripheral device, a sensor device, or another type of device.

In this example, the receiver 230 may process the analog signal from the wired channel 220 into a processed analog signal, and output the processed analog signal to the ADC 240 for digital conversion. Processing performed by the receiver 230 may include filtering, amplification, equalization, etc. The ADC 240 converts the processed analog signal into a digital signal, and outputs the digital signal to the processor 250. The processor 250 may then process the digital signal to recover data from the digital signal and process the recovered data. The processor 250 may include a processor core, a digital signal processor (DSP), an application specific integrated circuit (ASIC), a field programmable gate array (FPGA) or other programmable logic device, or any combination thereof.

Thus, FIGS. 1 and 2 show examples of systems in which ADCs according to aspects of the present disclosure may be used. However, it is to be appreciated that ADCs according to aspects of the present disclosure may also be used in other types of systems to convert an analog signal into a digital signal.

The ADC 140 in FIG. 1 and the ADC 240 in FIG. 2 may each be implemented with a successive approximation register (SAR) ADC. In this regard, FIG. 3 shows a simplified block diagram of an example of a SAR ADC 310 according to aspects of the present disclosure. The exemplary SAR ADC 310 is intended to illustrate the general concept of the use of successive approximate in analog-to-digital conversion known in the art. It is to be appreciated that the present disclosure is not limited to the exemplary SAR ADC 310 shown in FIG. 3.

The SAR ADC 310 is configured to receive an analog input voltage (labeled "Vin") at an input 312, convert the analog input voltage Vin into a digital signal, and output the digital signal at an output 315. The digital signal includes bits (e.g., sequence of bits) providing a digital representation of the analog input voltage Vin.

The SAR ADC 310 includes a sample and hold circuit 320, a comparator 330, an SAR 340 (also referred to as SAR logic or another term), and a digital-to-analog converter (DAC) 350. The sample and hold circuit 320 has an input 322 coupled to the input 312 of the SAR ADC 310 and an output 324 coupled to a first input 332 of the comparator 330. The sample and hold circuit 320 is configured to sample the analog input voltage Vin at the input 312 of the SAR ADC 310, and hold the sampled input voltage Vin at the first input 332 of the comparator 330.

The SAR 340 has an input 342 coupled to an output 336 of the comparator 330, a first output 344 coupled to the output 315 of the SAR ADC 310, and a second output 346. The DAC 350 has an input 352 coupled to the second output 346 of the SAR 340 and an output 354 coupled to the second input 334 of the comparator 330. The DAC 350 may be an n-bit DAC configured to receive an n-bit digital signal from the SAR 340 at the input 352, convert the n-bit digital signal into a DAC voltage (labeled "Vdac"), and output the DAC voltage Vdac to the second input 334 of the comparator 330 via the output 354. The DAC voltage Vdac may be given as follows:

$$V dac = b_{n-1} \cdot \frac{V_{ref}}{2} + b_{n-2} \cdot \frac{V_{ref}}{4} + b_{n-3} \cdot \frac{V_{ref}}{8} + \ldots + b_0 \cdot \frac{V_{ref}}{2^n} \quad (1)$$

where Vref is a reference voltage, and $b_{n-1}$ to $b_0$ are the n bits of the digital signal from the SAR 340. In this example, $b_{n-1}$ is the most significant bit (MSB) and $b_0$ is the least significant bit (LSB). It is to be appreciated that the DAC voltage Vdac is not limited to the example given in equation (1).

The comparator 330 is configured to compare the sampled input voltage Vin with the DAC voltage Vdac, and output a compare signal at the output 336, in which the logic value (i.e., logic state) of the compare signal indicates whether the sampled input voltage Vin is greater than or less than the DAC voltage Vdac. In one example, the compare signal is one (i.e., logic one) if the sampled input voltage Vin is greater than the DAC voltage Vdac, and the compare signal is zero (i.e., logic zero) if the sampled input voltage Vin is less than the DAC voltage Vdac. The SAR 340 is configured to convert the sampled input voltage Vin into a digital value at the output 315 using the comparator 330 and the DAC 350, as discussed further below. In some implementations, a logic one may correspond to a voltage approximately equal to a supply voltage, and a logic zero may correspond to a voltage approximately equal to zero volts.

The SAR ADC 310 is configured to convert the input voltage Vin into a digital signal in an analog-to-digital conversion operation that includes a sampling phase and a conversion phase. During the sampling phase, the sample and hold circuit 320 samples the input voltage Vin at the input 312 of the SAR ADC 310. During the conversion phase, the sample and hold circuit 320 holds the sampled input voltage Vin at the first input 332 of the comparator 330.

During the conversion phase, the SAR 340 converts the sampled input voltage Vin into a digital signal at the output 315 using the comparator 330 and the DAC 350. To do this, the SAR 340 may output a digital signal to the DAC 350, and sequentially resolve (i.e., determine) the bits $b_{n-1}$ to $b_0$ of the digital signal based on the compare signal from the output 336 of the comparator 330 utilizing a binary search, as discussed in the following.

The SAR 340 starts the binary search with the MSB $b_{n-1}$. The SAR 340 resolves the MBS $b_{n-1}$ during a first conversion cycle. To resolve the MSB $b_{n-1}$, the SAR 340 sets the MSB $b_{n-1}$ to one and the remaining bits $b_{n-2}$ to $b_0$ to zero. This causes the DAC 350 to output a voltage of ½Vref to the second input 334 of the comparator 330 (i.e., Vdac=½Vref). The SAR 340 then resolves the MSB $b_{n-1}$ based on the output of the comparator 330. If the compare signal is one (i.e., the sampled input voltage Vin is greater than ½Vref), then the SAR 340 resolves the MSB $b_{n-1}$ to a bit value of one. If the compare signal is zero (i.e., the sampled input voltage Vin is less than ½Vref), then the SAR 340 resolves the MSB $b_{n-1}$ to a bit value of zero.

After resolving the MSB $b_{n-1}$, the SAR 340 resolves the second most significant bit $b_{n-2}$ during a second conversion cycle. To resolve bit $b_{n-2}$, the SAR 340 sets the MSB $b_{n-1}$ to its resolved bit value, sets bit $b_{n-2}$ to one, and sets the remaining bits $b_{n-3}$ to $b_0$ to zero. This causes the DAC 350 to output a voltage of ¼Vref to the second input 334 of the comparator 330 (i.e., Vdac=¼Vref) if the resolved bit value of the MSB $b_{n-1}$ is zero, and output a voltage of ¾Vref if the resolved bit value of the MSB $b_{n-1}$ is one. The SAR 340 then resolves (i.e., determines) bit $b_{n-2}$ based on the output of the comparator 330. If the compare signal is one, then the SAR 340 resolves bit $b_{n-2}$ to a bit value of one. If the compare signal is zero, then the SAR 340 resolves bit $b_{n-2}$ to a bit value of zero.

The SAR 340 may repeat the above process for each of the remaining bits $b_{n-3}$ to $b_0$ to resolve the remaining bits $b_{n-3}$ to $b_n$. In this example, the SAR 340 resolves all n bits $b_{n-1}$ to $b_0$ over n conversion cycles. After all n bits $b_{n-1}$ to $b_0$ have been resolved, the SAR 340 may output a digital signal (also referred to as a digital code) at the output 315 including the resolved bits $b_{n-1}$ to $b_0$.

Figure 4:
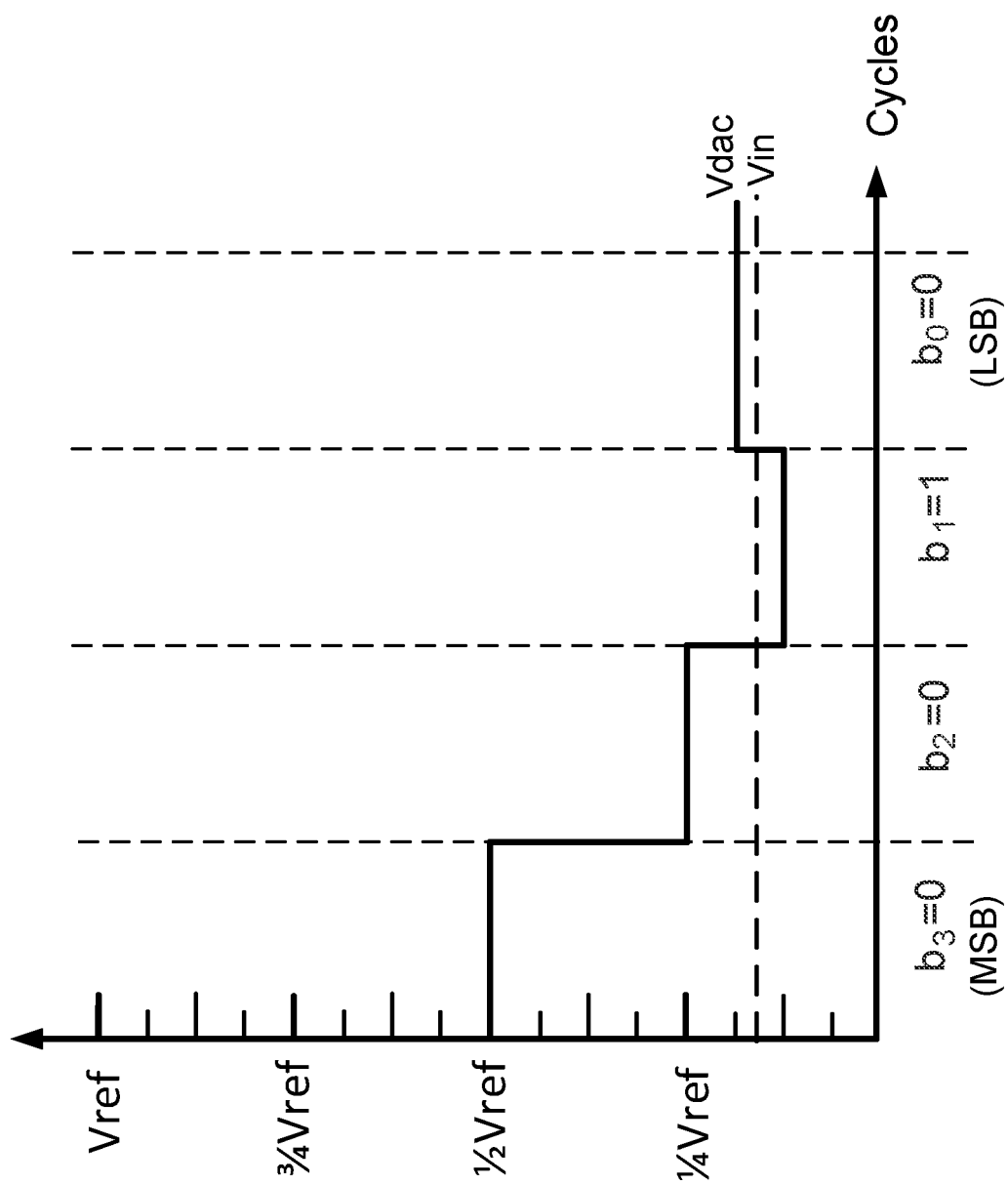
FIG. 4 is a plot showing an example of a digital-to-analog converter (DAC) voltage in a SAR ADC over multiple conversion cycles according to certain aspects of the present disclosure.

FIG. 4 shows an example of the DAC output voltage Vdac over n conversion cycles for an exemplary input voltage Vin. For case of illustration, the digital signal has four bits (i.e., n=4) in this example where bit $b_3$ is the MSB and bit $b_0$ is the LSB. However, it is to be appreciated that the digital signal may have a larger number of bits (i.e., n>4). As shown in FIG. 4, the SAR ADC 310 resolves one bit of the digital signal during each conversion cycle starting with the MSB and ending with the LSB. At the end of the conversion cycles, the DAC output voltage Vdac is close to the input voltage Vin.

The SAR ADC 310 may perform the analog-to-digital conversion discussed above periodically to track the input voltage Vin over time. For example, the sample and hold circuit 320 may receive a sampling clock signal. In this example, during each cycle (i.e., period) of the sampling clock signal, the sample and hold circuit 320 samples the input voltage Vin and the SAR ADC 310 converts the sampled input voltage Vin into an n-bit digital signal (i.e., digital code). Thus, in this example, the SAR ADC 310 may perform the analog-to-digital conversion discussed above for each cycle of the sampling clock signal. The sampling clock signal may have a frequency, for example, anywhere in the range of tens of kilohertz to over a gigahertz. However, it is to be appreciated that the SAR ADC 310 is not limited to this example.

Conventionally, the SAR ADC 310 performs each analog-to-digital conversion of the input voltage Vin over n conversion cycles regardless of the voltage level of the input voltage Vin. A problem with this approach is that the input voltage Vin may vary over a small voltage range most of the time. For small voltage variations, performing all n conversion cycles for each analog-to-digital conversion is power inefficient. This is because, when the input voltage Vin varies over a small voltage range, the most significant bits of the digital signal do not change. As a result, most of the time, performing the full n conversion cycles for each analog-to-digital conversion is redundant for the most significant bits of the digital signal (e.g., because the most significant bits of the digital signal remain zero for most of the time).

Figure 5:
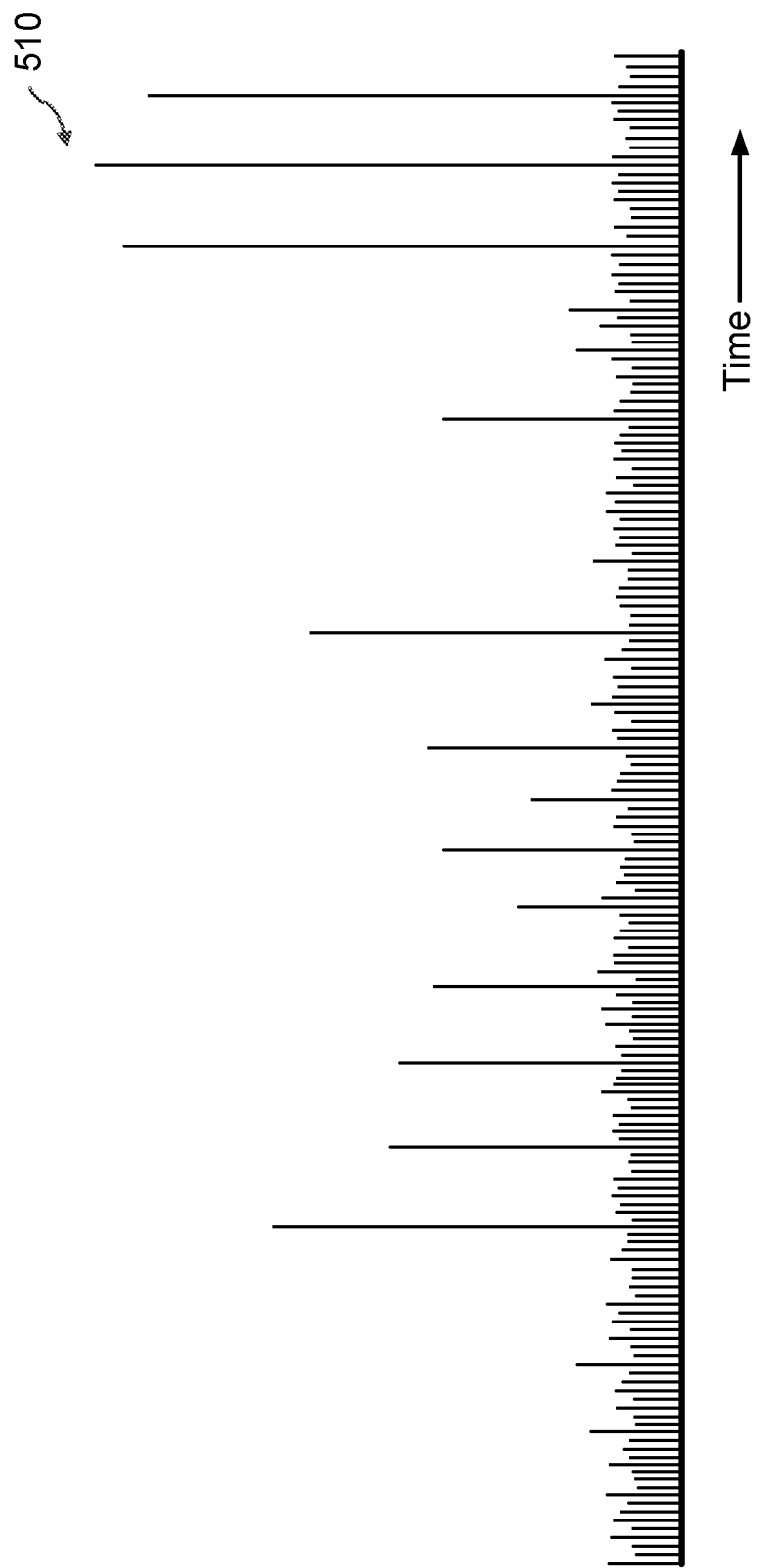
FIG. 5 is a plot showing an example of an input voltage over time according to certain aspects of the present disclosure.

In this regard, FIG. 5 shows an example of sampled input voltage Vin of a signal 510 (e.g., a Global Navigation Satellite System (GNSS) signal) over time. In this example, a SAR ADC (e.g., the SAR ADC 310) is used to convert the input voltage Vin of the signal 510 into a digital signal. In the example shown in FIG. 5, the signal 510 includes several high-amplitude spikes, in which the input voltage range of the SAR ADC is large enough to digitize the high-amplitude spikes. However, most of the time, the input voltage Vin of the signal 510 resides within a small voltage range (e.g., a voltage range that is four times or more smaller than the voltage of the highest one of the high-amplitude spikes), as shown in FIG. 5. Thus, the probably of the input voltage Vin of the signal 510 being within the small voltage range is much higher than the probability of the high-amplitude spikes. As a result, performing the full n conversion cycles for each analog-to-digital conversion of the input voltage Vin of the signal 510 is power inefficient. Thus, techniques for increasing the power efficiency of a SAR ADC for cases where the input signal resides within a small voltage range most of the time (e.g., 70% or more of the time) is desirable.

To address this, aspects of the present disclosure provide input-adaptive analog-to-digital conversion in which the number of conversion cycles is adapted based on the level (i.e., amplitude) of the input voltage Vin, as discussed further below.

In certain aspects, at the start of each analog-to-digital conversion of the input voltage Vin, a SAR ADC (e.g., SAR ADC 310) compares the input voltage Vin with a threshold voltage. If the input voltage Vin is greater than the threshold voltage, then the SAR ADC resolves each bit of the digital signal over n conversion cycles. If the input voltage Vin is less than the threshold voltage, then the SAR ADC resolves the last m bits of the digital signal over m conversion cycles where m is less than n. In this case, the SAR ADC may assume that the higher-order bits are zero. When the input voltage Vin is less than the threshold voltage most of the time, the average number of conversion cycles performed by the SAR ADC per analog-to-digital conversion is less than n, thereby increasing power efficiency.

Figure 6:
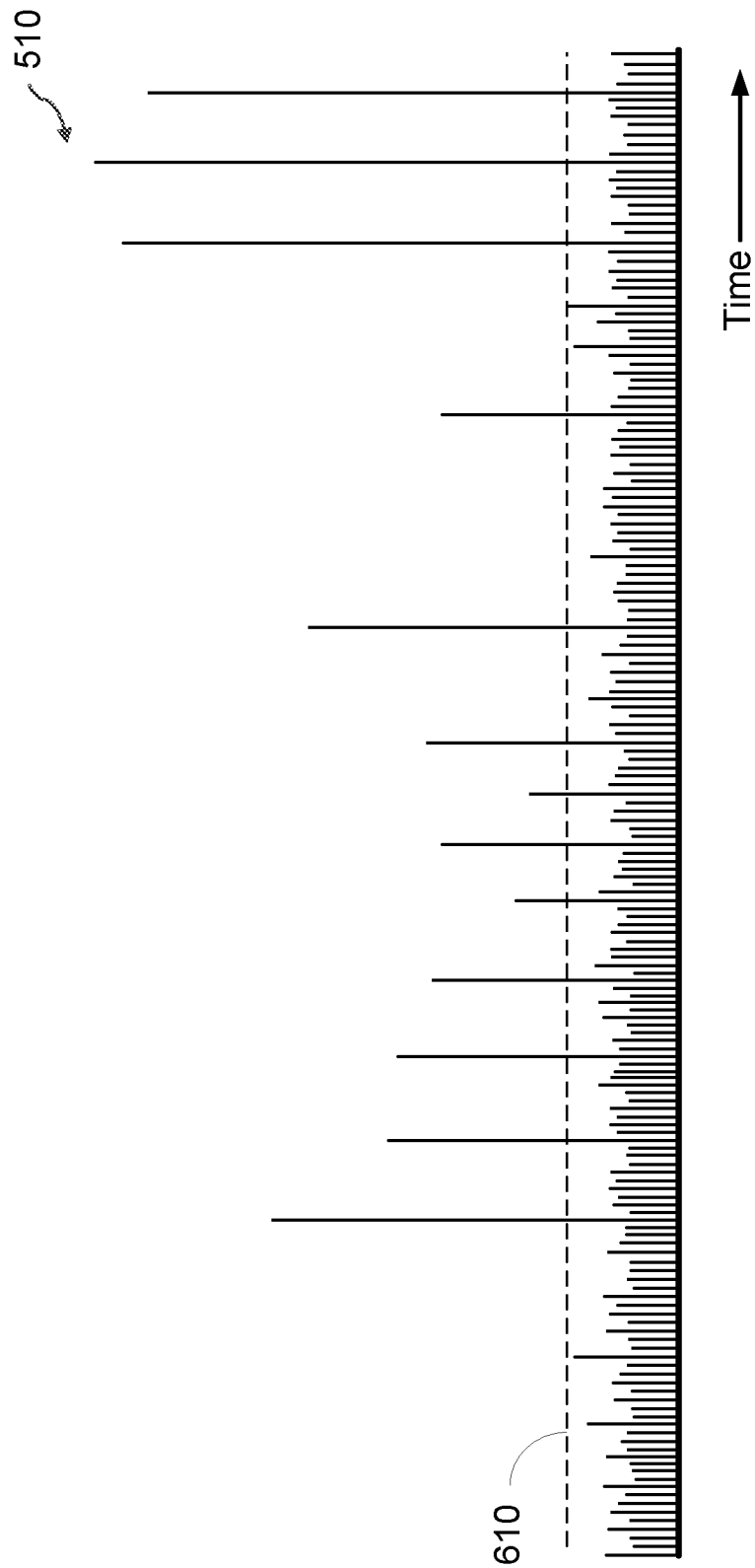
FIG. 6 shows the plot of FIG. 5 with an example of a threshold voltage according to certain aspects of the present disclosure.

In this regard, FIG. 6 shows the exemplary plot in FIG. 5 with an example of the threshold voltage 610. In this example, the input voltage Vin is below the threshold voltage 610 most of the time. As a result, the SAR ADC resolves the last m bits for most analog-to-digital conversions of the input voltage Vin instead of resolving all n bits. This causes the average number of conversion cycles performed by the SAR ADC per analog-to-digital conversion to be less than n, thereby increasing power efficiency.

Figure 7:
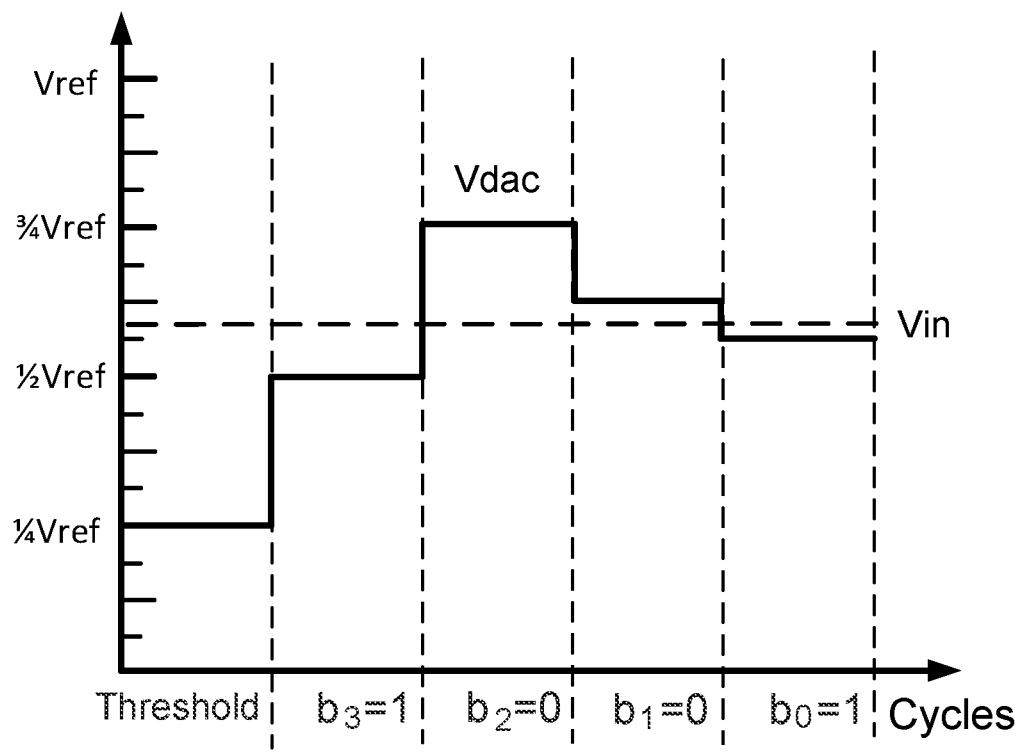
FIG. 7 is a plot showing an example of conversion cycles for a case where the input voltage is greater than the threshold voltage according to certain aspects.

FIG. 7 shows an example of the DAC output voltage Vdac during an analog-to-digital conversion for a case where the input voltage Vin is above the threshold voltage. In this example, the threshold voltage is Vref/4 and the number of bits is four (i.e., n=4). As shown in FIG. 7, the SAR ADC compares the input voltage Vin with the threshold voltage of Vref/4 in a first cycle (labeled "Threshold"). Since the input voltage Vin is greater than the threshold voltage in this example, the SAR ADC resolves all four bits over four conversion cycles (i.e., full n conversion cycles). In this example, the SAR ADC performs five conversion cycles when the first cycle is counted as a conversion cycle.

Figure 8:
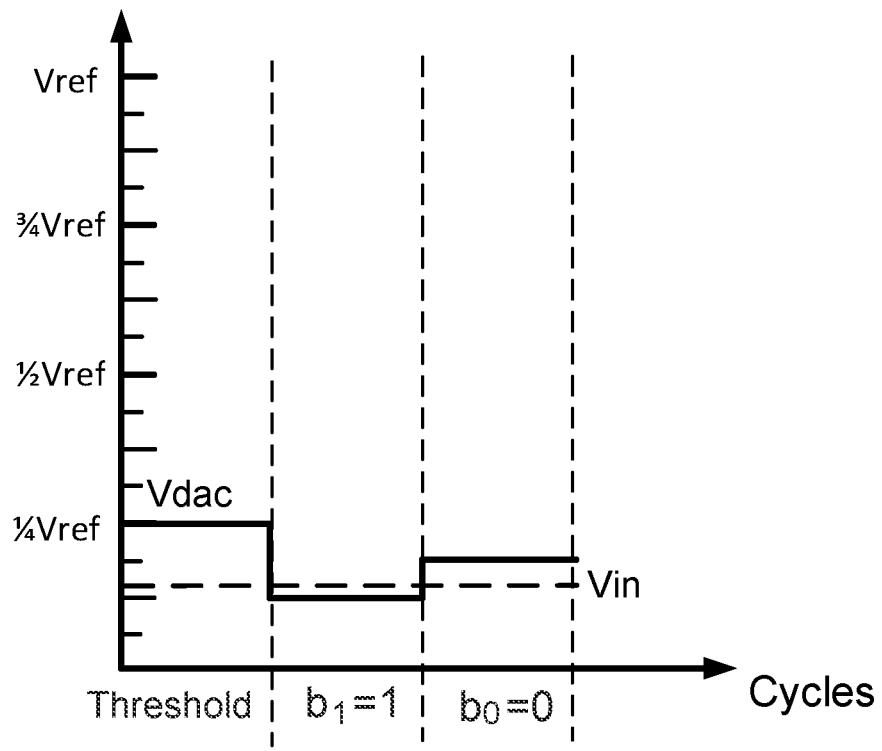
FIG. 8 is a plot showing an example of conversion cycles for a case where the input voltage is less than the threshold voltage according to certain aspects.

FIG. 8 shows an example of the DAC output voltage Vdac during an analog-to-digital conversion for a case where the input voltage Vin is below the threshold voltage of Vref/4. In this example, the SAR ADC resolves the last two bits when the input voltage Vin is below the threshold voltage (i.e., m=2 in this example). As shown in FIG. 8, the SAR ADC compares the input voltage Vin with the threshold voltage of Vref/4 in the first cycle (labeled "Threshold"). Since the input voltage Vin is less than the threshold voltage in this example, the SAR ADC resolves the last two bits over two conversion cycles. In this example, the SAR ADC performs three conversion cycles when the first cycle is counted as a conversion cycle.

Thus, in this example, the SAR ADC performs five conversion cycles when the input voltage Vin is greater than the threshold voltage, and performs three conversion cycles when the input voltage Vin is less than the threshold voltage. Even though comparing the input voltage Vin with the threshold voltage adds an additional conversion cycle, the average number of conversion cycles performed by the SAR ADC per analog-to-digital conversion is less than four (i.e., less than n) when the input voltage Vin is less than the threshold voltage most of the time. Thus, the average number of conversion cycles performed by the SAR ADC per analog-to-digital is reduced, thereby improving power efficiency. In the example illustrated in FIGS. 7 and 8, the number of bits is four (i.e., n=4) for ease of illustration. However, it is to be appreciated that the number of bits may be larger (e.g., n=6, n=7, n=8, etc.) with a potentially greater reduction in the average number of conversion cycles than the example illustrated in FIGS. 7 and 8.

Figure 9:
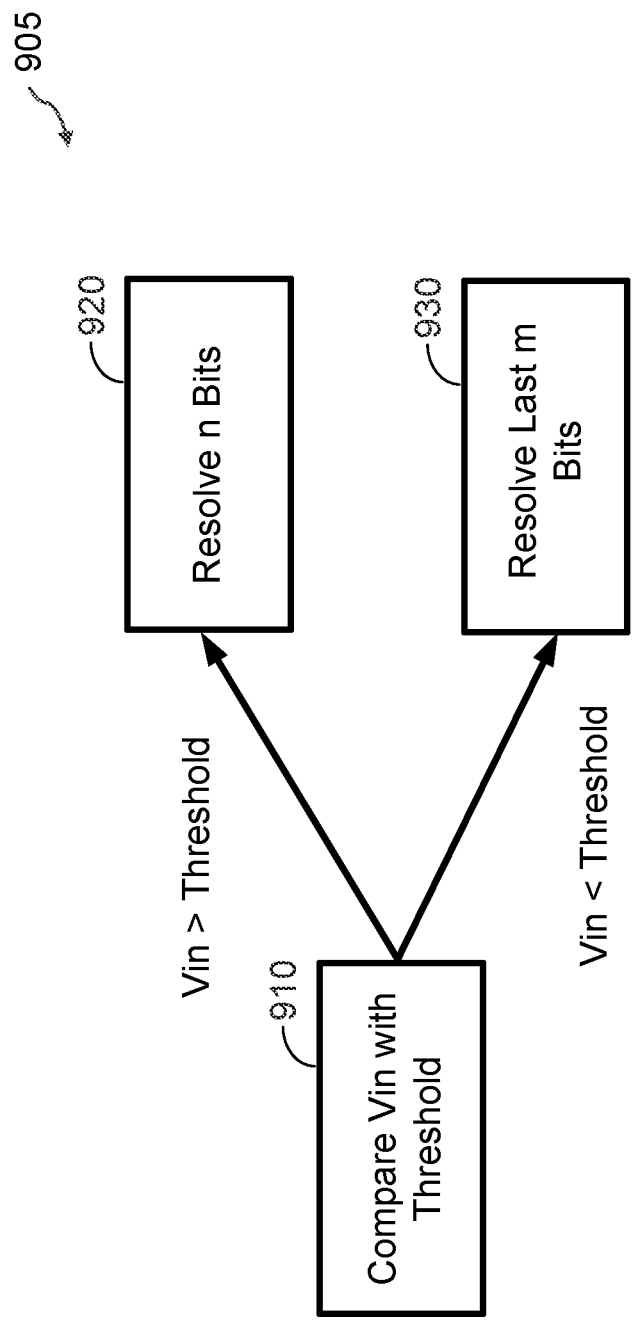
FIG. 9 is a flowchart illustrating a method of input-adaptive analog-to-digital conversion using a threshold voltage according to certain aspects of the present disclosure.

FIG. 9 shows a flowchart of an exemplary method 905 of input-adaptive analog-to-digital conversion according to certain aspects. At block 910, the SAR ADC (e.g., SAR ADC 310) compares the input voltage Vin with a threshold voltage. For example, the SAR (e.g., SAR 340) may set the DAC voltage Vdac to the threshold voltage, and the comparator (e.g., comparator 330) may compare the threshold voltage with the input voltage Vin. If the input voltage Vin is greater than the threshold voltage, then the SAR ADC resolves all n bits of the digital signal over n conversion cycles at block 920. If the input voltage Vin is less than the threshold voltage, then the SAR ADC resolves the last m bits of the digital signal over m conversion cycles at block 930 where m is less than n. In this case, the number of conversion cycles is reduced.

It is to be appreciated that input-adaptive analog-to-digital conversion according to aspects of the present disclosure is not limited to a single threshold. For example, input-adaptive analog-to-digital conversion according to aspects of the present disclosure may be expanded to use two or more thresholds to adapt the number of conversion cycles for different ranges of the input voltage Vin.

Figure 10:
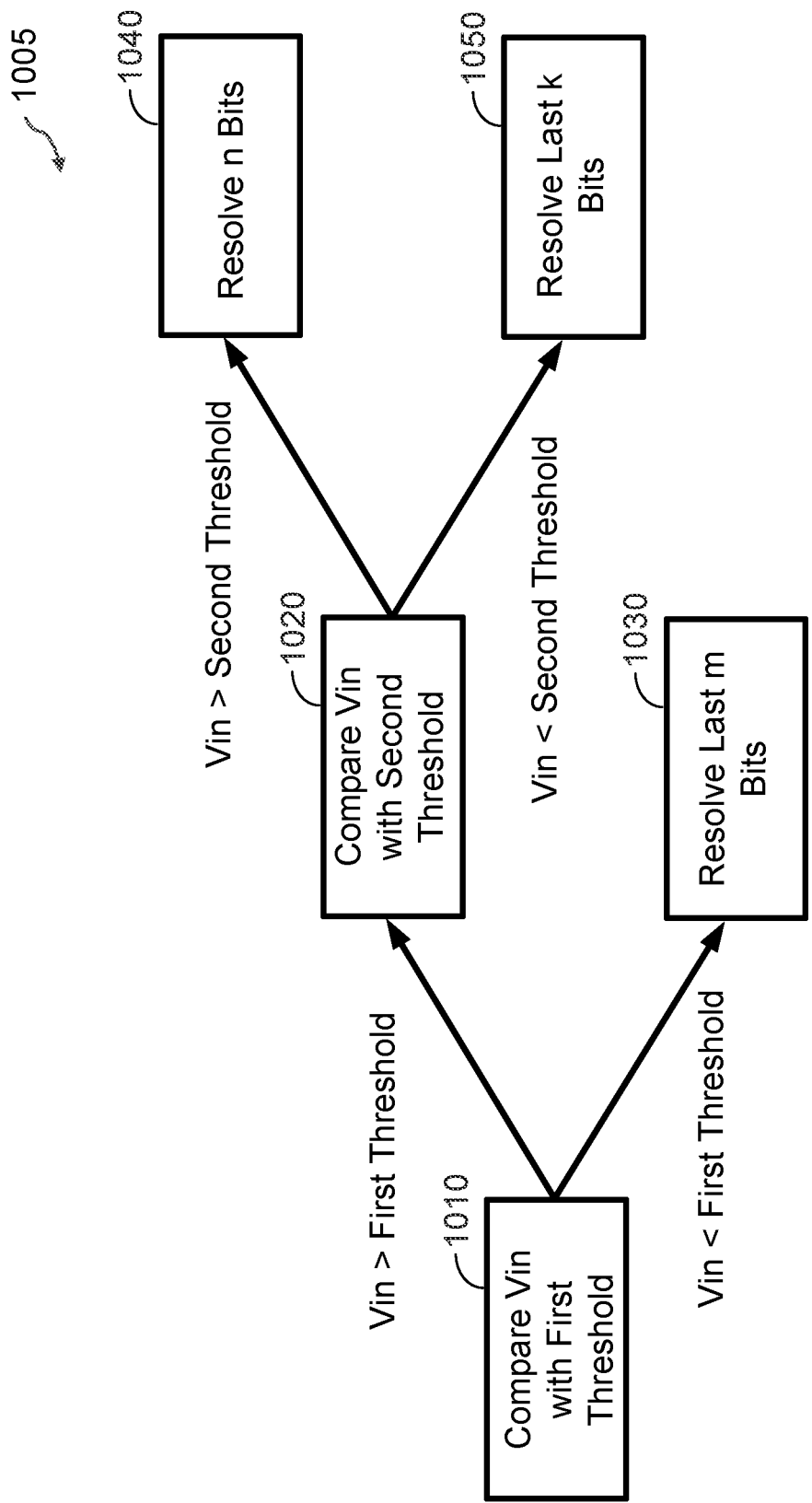
FIG. 10 is a flowchart illustrating a method of input-adaptive analog-to-digital conversion using a first threshold voltage and a second threshold voltage according to certain aspects of the present disclosure.

In this regard, FIG. 10 shows a flowchart of an exemplary method 1005 of input-adaptive analog-to-digital conversion according to certain aspects, in which a first threshold voltage and a second threshold voltage are used to adapt the number of conversion cycles for multiple voltage ranges. In this example, the second threshold voltage is greater than the first threshold voltage. Also, in this example, the input voltage Vin may be within a first voltage range (e.g., low voltage range) when the input voltage Vin is less than the first threshold voltage, and the input voltage Vin may be within a second voltage range (e.g., medium voltage range) when the input voltage is between the first threshold voltage and the second threshold voltage.

At block 1010, the SAR ADC (e.g., SAR ADC 310) compares the input voltage Vin with the first threshold voltage. For example, the SAR (e.g., SAR 340) may set the DAC voltage Vdac to the first threshold voltage, and the comparator (e.g., comparator 330) may compare the first threshold voltage with the input voltage Vin. If the input voltage Vin is greater than the first threshold voltage, then the SAR ADC may proceed to block 1020. If the input voltage Vin is less than the first threshold voltage, then the SAR ADC resolves the last m bits of the digital signal over m conversion cycles at block 1030 where m is less than n. In this case, the input voltage Vin may be within the first voltage range (e.g., low voltage range) below the first threshold voltage.

At block 1020, the SAR ADC (e.g., SAR ADC 310) compares the input voltage Vin with the second threshold voltage. For example, the SAR (e.g., SAR 340) may set the DAC voltage Vdac to the second threshold voltage, and the comparator (e.g., comparator 330) may compare the second threshold voltage with the input voltage Vin. If the input voltage Vin is greater than the second threshold voltage, then the SAR ADC resolves all n bits of the digital signal over n conversion cycles at block 1040. If the input voltage Vin is less than the second threshold voltage, then the SAR ADC resolves the last k bits of the digital signal over k conversion cycles at block 1050 where k is greater than m and less than n (i.e., n>k>m). In this case, the input voltage Vin may be within the second voltage range (e.g., medium voltage range) between the second threshold voltage and the first threshold voltage.

The DAC 350 may be implemented with a capacitive DAC according to certain aspects. In these aspects, the sample function and/or hold function of the sample and hold circuit 320 may be integrated into the capacitive DAC. Also, the capacitive DAC may be configured to provide one or more threshold voltages for input-adaptive analog-to-digital conversion, as discussed further below.

Figure 11:
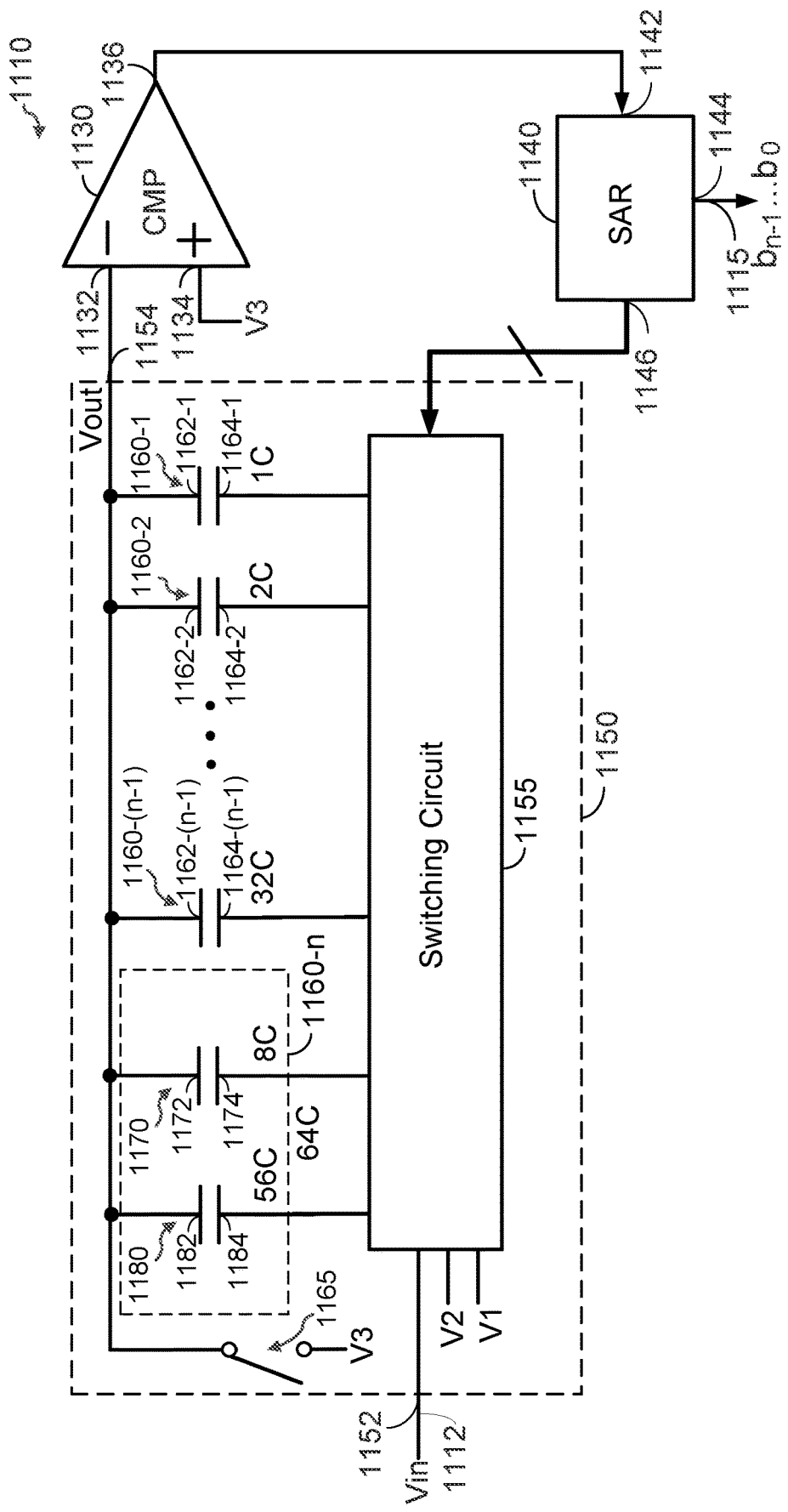
FIG. 11 shows an example of a SAR ADC including a capacitive digital-to-analog converter (DAC) configured to provide a threshold voltage according to certain aspects of the present disclosure.

FIG. 11 shows an example of a SAR ADC 1110 including a capacitive DAC 1150 according to aspects of the present disclosure. The SAR ADC 1110 also includes a comparator 1130 and a SAR 1140 (also referred to as SAR logic). The SAR ADC 1110 is configured to receive an analog input voltage Vin at an input 1112, convert the analog input voltage Vin into a digital signal, and output the digital signal at an output 1115. As discussed further below, the capacitive DAC 1150 is configured to provide a threshold voltage for input-adaptive analog-to-digital conversion according to certain aspects. The capacitive DAC 1150 receives a first voltage V1 and a second voltage V2, which are discussed further below.

In the example in FIG. 11, the capacitive DAC 1150 has an input 1152 coupled to the input 1112 of the SAR ADC 1110 and an output 1154 coupled to a first input 1132 of the comparator 1130. The comparator 1130 has a second input 1134 coupled to a third voltage V3. In some implementations, the third voltage V3 may be at ground potential (i.e., the second input 1134 may be coupled to ground). However, it is to be appreciated that the present disclosure is not limited to this example, and that the third voltage V3 may be a positive non-zero voltage or a negative non-zero voltage in other implementations. In certain aspects, the comparator 1130 is configured to compare the output voltage Vout of the capacitive DAC 1150 with the third voltage V3, and output a compare signal based on the comparison. For example, the compare signal may have a first logic value (e.g., one) when the third voltage V3 is greater than the output voltage Vout, and a second logic value (i.e., zero) when the third voltage V3 is less than the output voltage Vout.

The SAR 1140 has an input 1142 coupled to an output 1136 of the comparator 1130, a first output 1144 coupled to the output 1115 of the SAR ADC 1110, and a second output 1146 coupled to the capacitive DAC 1150.

In the example in FIG. 11, the capacitive DAC 1150 includes binary-weighted capacitors 1160-1 to 1160-$n$. For case of illustration, only the capacitors 1160-$n$, 1160-$(n-1)$, 1160-2, and 1160-1 are explicitly shown in FIG. 11. In certain aspects, each of the binary-weighted capacitors 1160-1 to 1160-$n$ corresponds to a respective one of the bits $b_{n-1}$ to $b_0$ of the digital signal. More particularly, the capacitor 1160-1 corresponds to the LSB $b_0$ of the digital signal and the capacitor 1160-$n$ corresponds to the MSB $b_{n-1}$. In this regard, the capacitor 1160-$n$ may also be referred to as the MSB capacitor. The MSB capacitor 1160-$n$ has the largest capacitance among the binary-weighted capacitors 1160-1 to 1160-$n$, as discussed further below. The capacitors 1160-1 to 1160-$(n-1)$ may be referred to as lower-order capacitors since each of the lower-order capacitors has a smaller capacitance (i.e., lower weight) than the MSB capacitor 1160-$n$.

The binary-weighted capacitors 1160-1 to 1160-$n$ have binary-weighted capacitances, in which the capacitor 1160-1 corresponding to the LSB $b_0$ has the smallest capacitance (i.e., smallest weight) and the MSB capacitor 1160-$n$ corresponding to the MSB $b_{n-1}$ has the largest capacitance (i.e., largest weight). In the example in FIG. 11, each of the capacitors 1160-2 to 1160-$n$ has a capacitance that is approximately twice the capacitance of the capacitor to the immediate right. For example, the capacitor 1160-2 has twice the capacitance of the capacitor 1160-1, the capacitor 1160-3 (not explicitly shown in FIG. 11) has twice the capacitance of the capacitor 1160-2, and so forth. The MSB capacitor 1160-$n$ has twice the capacitance of the capacitor 1160-$(n-1)$, which corresponds to the second most significant bit $b_{n-2}$. The capacitance of the capacitor 1160-1 corresponding to the LSB may also be referred to as a unit capacitance. In this example, the MSB capacitor 1160-$n$ has a capacitance that is equal to $2^{n-1}$ times the unit capacitance, or approximately equal to the sum of the capacitances of the lower-order capacitors 1160-1 to 1160-$(n-1)$.

FIG. 11 shows an example of the capacitances of the capacitors 1160-1 to 1160-$n$ for an example where the number of bits in the digital signal is seven (i.e., n=7). In this example, the capacitor 1160-1 has a capacitance equal to the unit capacitance (i.e., 1C) and the MSB capacitor 1160-$n$ has a capacitance equal to 64 times the unit capacitance (i.e., 64C). However, it is to be appreciated that the present disclosure is not limited to this example. In general, the MSB capacitor 1160-$n$ has a capacitance equal to $2^{n-1}$ times the unit capacitance.

In this example, the MSB capacitor 1160-$n$ includes a first capacitor 1170 and a second capacitor 1180, in which the capacitance of the MSB capacitor 1160-$n$ is split between the first capacitor 1170 and the second capacitor 1180. The first capacitor 1170 is used to provide the threshold voltage for input-adaptive analog-to-digital conversion, as discussed further below. In this regard, the first capacitor 1170 may also be referred to as a threshold capacitor. Splitting the capacitance of the MSB capacitor 1160-$n$ to provide the threshold capacitor reduces the number of capacitors needed to implement input-adaptive analog-to-digital conversion according to aspect of the present disclosure. In certain aspects, the sum of the capacitance of the first capacitor 1170 and the capacitance of the second capacitor 1180 is equal to the capacitance of the MSB capacitor 1160-$n$, which is equal to $2^{n-1}$ times the unit capacitance, or approximately equal to the sum of the capacitances of the lower-order capacitors 1160-1 to 1160-$(n-1)$.

The capacitance of the first capacitor 1170 may be sized to provide a desired threshold voltage for input-adaptive analog-to-digital conversion. For example, the capacitance of the first capacitor 1170 may be larger for a larger threshold voltage, and smaller for a smaller threshold voltage. In the example shown in FIG. 11, the capacitance of the first capacitor 1170 is 8C (i.e., eight times the unit capacitance). However, it is to be appreciated that the present disclosure is not limited to this example. It is also to be appreciated that the capacitance of the first capacitor 1170 is not limited to a capacitance that is equal to a power of two of the unit capacitance. In the example shown in FIG. 11, the capacitance of the second capacitor 1180 is 56C. However, it is to be appreciated that the present disclosure is not limited to this example.

In the example shown in FIG. 11, each of the lower-order capacitors 1160-1 to 1160-($n$−1) has a first terminal 1162-1 to 1162-($n$−1) coupled to the output 1154 of the capacitive DAC 1150 and a second terminal 1164-1 to 1164-($n$−1). The first capacitor 1170 has a first terminal 1172 coupled to the output 1154 of the capacitive DAC 1150 and a second terminal 1174, and the second capacitor 1180 has a first terminal 1182 coupled to the output 1154 of the capacitive DAC 1150 and a second terminal 1184. A terminal of a capacitor may also be referred to as a plate, an electrode, or another term.

In the example shown in FIG. 11, the capacitive DAC 1150 also includes a switching circuit 1155 coupled to the second terminal 1164-1 to 1164-($n$−1) of the capacitors 1160-1 to 1160-($n$−1), the second terminal 1174 of the first capacitor 1170, and the second terminal 1184 of the second capacitor 1180. The switching circuit 1155 may also be coupled to the input 1152 of the capacitive DAC 1150, the second voltage V2, and the first voltage V1. In operation, the switching circuit 1155 may be configured to switch the second terminal 1164-1 to 1164-($n$−1), 1174, and 1184 of each the capacitors 1160-1 to 1160-($n$−1), 1170, and 1180 between the input 1152, the first voltage V1, and the second voltage V2 based on one or more control signals from the SAR 1140. In other words, the switching circuit 1155 may be configured to selectively couple the second terminal 1164-1 to 1164-($n$−1), 1174, and 1184 of each the capacitors 1160-1 to 1160-($n$−1), 1170, and 1180 to the input 1152, to the first voltage V1, or to the second voltage V2 based on the one or more control signals from the SAR 1140.

In certain aspects, the difference between the second voltage V2 and the first voltage V1 provides a reference voltage Vref (i.e., V2−V1=Vref) for resolving bits. In some implementation, the first voltage V1 may be at ground potential. In these implementations, the second voltage V2 is equal to the reference voltage Vref (i.e., V2=Vref), in which the reference voltage Vref is a positive non-zero voltage or a negative non-zero voltage. However, it is to be appreciated that the present disclosure is not limited to this example. In some implementations, both the first voltage V1 and the third voltage V3 may be at ground potential. Thus, in these implementations, the first voltage V1 and the second voltage V3 may be equal. However, it is to be appreciated that the present disclosure is not limited to this example. For example, in other implementations, the first voltage V1 may be at ground potential while the third voltage V3 is a positive non-zero voltage or a negative non-zero voltage. In this example, the second voltage V2 is equal to the reference voltage Vref.

In the example shown in FIG. 11, the capacitive DAC 1150 also includes a switch 1165 coupled between the output 1154 of the capacitive DAC 1150 and the third voltage V3. The on/off state of the switch 1165 may be controlled by the SAR 1140 in some implementations. For the example where the third voltage V3 is at ground potential, the switch 1165 is coupled between the output 1154 and ground.

As discussed above, the first voltage V1 may be at ground potential, or the first voltage V1 may be a positive non-zero voltage or a negative non-zero voltage. For the example where the first voltage V1 is at ground potential, the digital signal output by the SAR ADC 1110 provides a digital representation of the input voltage Vin (i.e., the SAR ADC 1110 digitizes or quantizes the input voltage Vin). For the example where the first voltage V1 is a positive non-zero value or a negative non-zero value, the digital signal output by the SAR ADC 1110 provides a digital representation of the voltage Vin−V1 (i.e., the SAR ADC 1110 digitizes or quantizes the voltage Vin−V1). For ease of discussion, exemplary operations of the SAR ADC 1110 are discussed below using the example where the first voltage V1 is at ground potential. However, it is to be appreciated that the present disclosure is not limited to this example.

The SAR ADC 1110 may convert the analog input voltage Vin at the input 1112 into a digital signal at the output 1115 in an analog-to-digital conversion operation based on the input-adaptive approach illustrated in FIG. 9. During the sampling phase, the SAR 1140 closes the switch 1165 and causes the switching circuit 1155 to couple the second terminals 1164-1 to 1164-($n$−1), 1174, and 1184 of the capacitors 1160-1 to 1160-($n$−1), 1170, and 1180 to the input 1152 of the capacitive DAC 1150 to sample the input voltage Vin.

At the start of the conversion phase, the SAR 1140 opens the switch 1165. To compare the sampled input voltage Vin with the threshold voltage, the SAR 1140 causes the switching circuit 1155 to couple the second terminal 1174 of the first capacitor 1170 to the second voltage V2 (e.g., Vref) and couple the second terminals 1164-1 to 1164-($n$−1), and 1184 of the capacitors 1160-1 to 1160-($n$−1), and 1180 to the first voltage V1. This causes the output voltage Vout of the capacitive DAC 1150 to be approximately equal to V3+Vth−Vin, where Vth is the threshold voltage set by the capacitance of the first capacitor 1170. The threshold voltage Vth is a fraction of the reference voltage Vref in which the fraction is based on the capacitance of the first capacitor 1170 over the total capacitance of the capacitors 1160-1 to 1160-$n$. The comparator 1130 compares the output voltage Vout of the capacitive DAC 1150 with the third voltage V3 in this example, and outputs a compare signal based on the comparison. In this example, the output voltage Vout is less than the third voltage V3 when the sampled input voltage Vin is greater than the threshold voltage (i.e., V3+Vth−Vin<V3, which simplifies to Vth<Vin). Also, in this example, the output voltage Vout is greater than the third voltage V3 when the sampled input voltage Vin is less than the threshold voltage (i.e., V3+Vth−Vin>V3, which simplifies to Vth>Vin). Thus, in this example, the compare signal has the first logic value (e.g., one) if the sampled input voltage Vin is greater than the threshold voltage, and the compare signal has the second logic value (e.g., zero) if the sampled input voltage Vin is less than the threshold voltage. Note that the third voltage V3 does not affect the result of the comparison (i.e., the compare signal) since the third voltage V3 is applied to both inputs 1132 and 1134 of the comparator 1130 in this example.

The SAR 1140 may then determine whether to resolve (i.e., determine) all n bits of the digital signal or resolve the last m bits of the digital signal based on the compare signal. If the control signal indicates the input voltage is greater than the threshold voltage, then the SAR 1140 may resolve all n bits over n conversion cycles. To resolve the MSB $b_{n-1}$, the SAR 1140 causes the switching circuit 1155 to couple the second terminal 1184 of the second capacitor 1180 to the second voltage V2 (e.g., Vref) so that the second terminals 1174 and 1184 of first and second capacitors 1170 and 1180 are both coupled to the second voltage V2. The second terminals 1164-1 to 1164-($n$–1) of the lower-order capacitors 1160-1 to 1160-($n$–1) are left coupled to the first voltage V1. Thus, the switching circuit 1155 combines the first and second capacitors 1170 and 1180 to provide the MSB capacitor for resolving the MSB $b_{n-1}$.

The SAR 1140 then resolves the MSB $b_{n-1}$ based on the compare signal. If the compare signal has the first logic value (e.g., one) indicating the sampled input voltage Vin is greater than ½Vref, then the SAR 1140 resolves the MSB $b_{n-1}$ to a bit value of one. In this case, the SAR 1140 leaves the second terminals 1174 and 1184 of the first and second capacitors 1170 and 1180 coupled to the second voltage V2 (e.g., Vref). If, on the other hand, the compare signal has the second logic value (e.g., zero) indicating the sampled input voltage Vin is less than ½Vref, then the SAR 1140 resolves the MSB $b_{n-1}$ to a bit value of zero. In this case, the SAR 1140 may cause the switching circuit 1155 to switch the second terminals 1174 and 1184 of the first and second capacitors 1170 and 1180 to the first voltage V1.

After resolving the MSB $b_{n-1}$, the SAR 1140 resolves the second most significant bit $b_{n-2}$. To resolve bit $b_{n-2}$, the SAR 1140 causes the switching circuit 1155 to couple the second terminal 1164-($n$–1) of the respective capacitor 1160-($n$–1) to the second voltage V2 (e.g., Vref). The SAR 1140 then resolves the bit $b_{n-2}$ based on the compare signal from the comparator 1130. If the compare signal has the first logic value (e.g., one), then the SAR 1140 resolves the bit $b_{n-2}$ to a bit value of one. In this case, the SAR 1140 leaves the second terminal 1164-($n$–1) of the capacitor 1160-($n$–1) coupled to second voltage V2. If, on the other hand, the compare signal has the second logic value (e.g., zero), then the SAR 1140 resolves the bit $b_{n-2}$ to a bit value of zero. In this case, the SAR 1140 may cause the switching circuit 1155 to switch the second terminal 1164-($n$–1) of the capacitor 1160-($n$–1) back to the first voltage V1 (e.g., ground).

The SAR 1140 may repeat the above process for each of the remaining bits $b_{n-3}$ to $b_0$ to resolve the remaining bits $b_{n-3}$ to $b_0$. For example, for each of the bits $b_{n-3}$ to $b_0$, the SAR 1140 may cause the switching circuit 1155 to couple the second terminal 1164-1 to 1164-($n$–3) of the respective one of the capacitors 1160-1 to 1160-($n$–3) to the second voltage V2 (e.g., Vref), and resolve the bit value of the bit based on the compare signal from the comparator 1130 (e.g., resolve a bit value of one if the compare signal has the first logic value (e.g., one) and resolve a bit value of zero if the compare signal has the second logic value (e.g., zero)). After all n bits $b_{n-1}$ to $b_0$ of the digital signal have been resolved, the SAR 1140 may output the resolved bits $b_{n-1}$ to $b_0$ at the output 1115 of the SAR ADC 1110, in which the resolved bits $b_{n-1}$ to $b_0$ provide a digital representation of the sampled input voltage Vin.

If the control signal indicates the input voltage is less than the threshold voltage, then the SAR 1140 may resolve the last m bits over m conversion cycles where m is less than n (i.e., the total number of bits in the digital signal). In this case, the SAR 1140 may cause the switching circuit 1155 to switch the second terminal 1174 of the first capacitor 1170 to the first voltage V1 (e.g., ground potential) and resolve the last m bits $b_{m-1}$ to $b_0$ of the digital signal. The SAR 1140 may resolve the last m bits in the manner discussed above starting the conversion with bit $b_{m-1}$ instead the most signification bit MSB $b_{n-1}$. For example, for each of the last m bits $b_{m-1}$ to $b_0$, the SAR 1140 may cause the switching circuit 1155 to couple the second terminal 1164-1 to 1164-($m$–1) of the respective one of the capacitors 1160-1 to 1160-($m$–1) to the second voltage V2 (e.g., Vref), and resolve the bit value of the bit based on the compare signal from the comparator 1130 (e.g., resolve a bit value of one if the compare signal has the first logic value (e.g., one) and resolve a bit value of zero if the compare signal has the second logic value (e.g., zero)). After the last m bits $b_{m-1}$ to $b_0$ of the digital signal have been resolved, the SAR 1140 may output the resolved bits $b_{m-1}$ to $b_0$ at the output 1115 of the SAR ADC 1110. The SAR 1140 may also output a bit value of zero for each of the bits $b_{n-1}$ to $b_m$ having a higher order than the last m bits $b_{m-1}$ to $b_0$.

Thus, when the input voltage Vin is less than the threshold voltage set by the capacitance of the first capacitor 1170, the SAR 1140 resolves the last m bits over m conversion cycles. Since m is less than n, the SAR 1140 performs fewer conversion cycles when the input voltage Vin is less than the threshold voltage. For cases where the voltage Vin is below the threshold voltage most of the time, this reduces the average number of conversion cycles performed by the SAR 1140 per analog-to-digital conversion, thereby increasing power efficiency.

Figure 12:
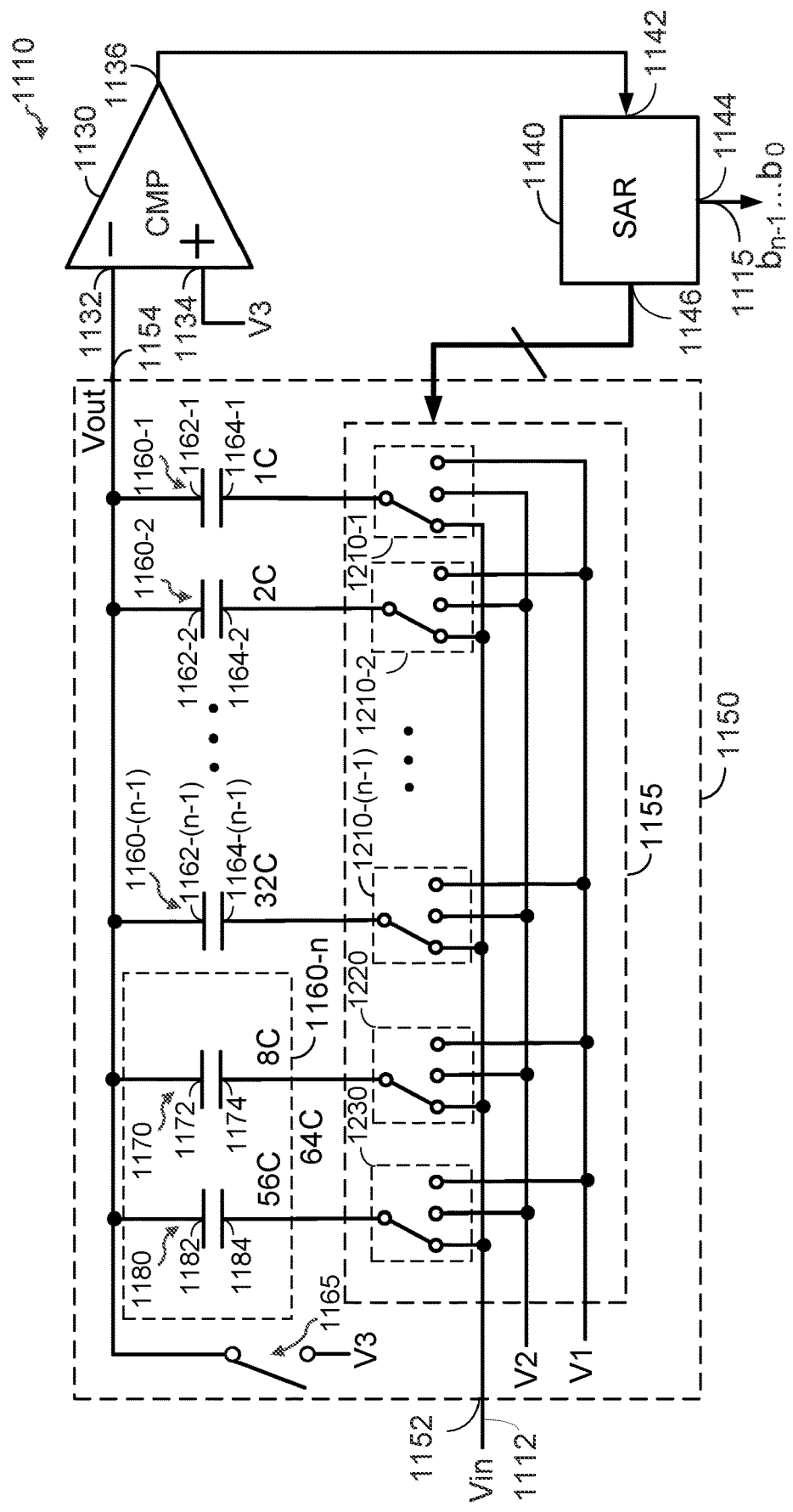
FIG. 12 shows an exemplary implementation of a switching circuit according to certain aspects of the present disclosure.

FIG. 12 shows an exemplary implementation of the switching circuit 1155 according to certain aspects. In this example, the switching circuit 1155 includes switches 1210-1 to 1210-($n$–1) for independently switching the lower-order capacitors 1160-1 to 1160-($n$–1), in which each of the switches 1210-1 to 1210-($n$–1) is coupled to the second terminal 1164-1 to 1164-($n$–1) of a respective one of the capacitors 1160-1 to 1160-($n$–1), the input 1152, the first voltage V1, and the second voltage V2. In operation, each of the switches 1210-1 to 1210-($n$–1) is configured to receive a respective control signal from the SAR 1140 and selectively couple the second terminal 1164-1 to 1164-($n$–1) of the respective one of the capacitors 1160-1 to 1160-($n$–1) to the input 1152, the second voltage V2, or the first voltage V1 based on the respective control signal. For ease of illustration, the individual connections between the switches 1210-1 to 1210-($n$–1) and the SAR 1140 are not explicitly shown in FIG. 12. Each of the switches 1210-1 to 1210-($n$–1) may be implemented with one or more switching transistors.

The switching circuit 1155 also includes a first switch 1220 and a second switch 1230 for independently switching the first capacitor 1170 and the second capacitor 1180, respectively. The first switch 1220 is coupled to the second terminal 1174 of the first capacitor 1170, the input 1152, the first voltage V1, and the second voltage V2. In operation, the first switch 1220 is configured to receive a first control signal from the SAR 1140 and selectively couple the second terminal 1174 of the first capacitor 1170 to the input 1152, the second voltage V2, or the first voltage V1 based on the first control signal.

The second switch 1230 is coupled to the second terminal 1184 of the second capacitor 1180, the input 1152, the first voltage V1, and the second voltage V2. In operation, the second switch 1230 is configured to receive a second control signal from the SAR 1140 and selectively couple the second terminal 1184 of the second capacitor 1180 to the input 1152, the second voltage V2, or the first voltage V1 based on the second control signal. For ease of illustration, the individual connections between the switches 1220 and 1230 and the SAR 1140 are not explicitly shown in FIG. 12.

Since the first switch 1220 and the second switch 1230 are controlled by separate control signals (i.e., the first and second control signals), the SAR 1140 can independently switch the first capacitor 1170 and the second capacitor 1180. The independent control of the switches 1220 and 1230 allows the SAR 1140 to use the first capacitor 1170 to provide the threshold voltage, and combine the first capacitor 1170 and the second capacitor 1180 to provide the MSB capacitance for resolving the MSB $b_{n-1}$.

Figure 13:
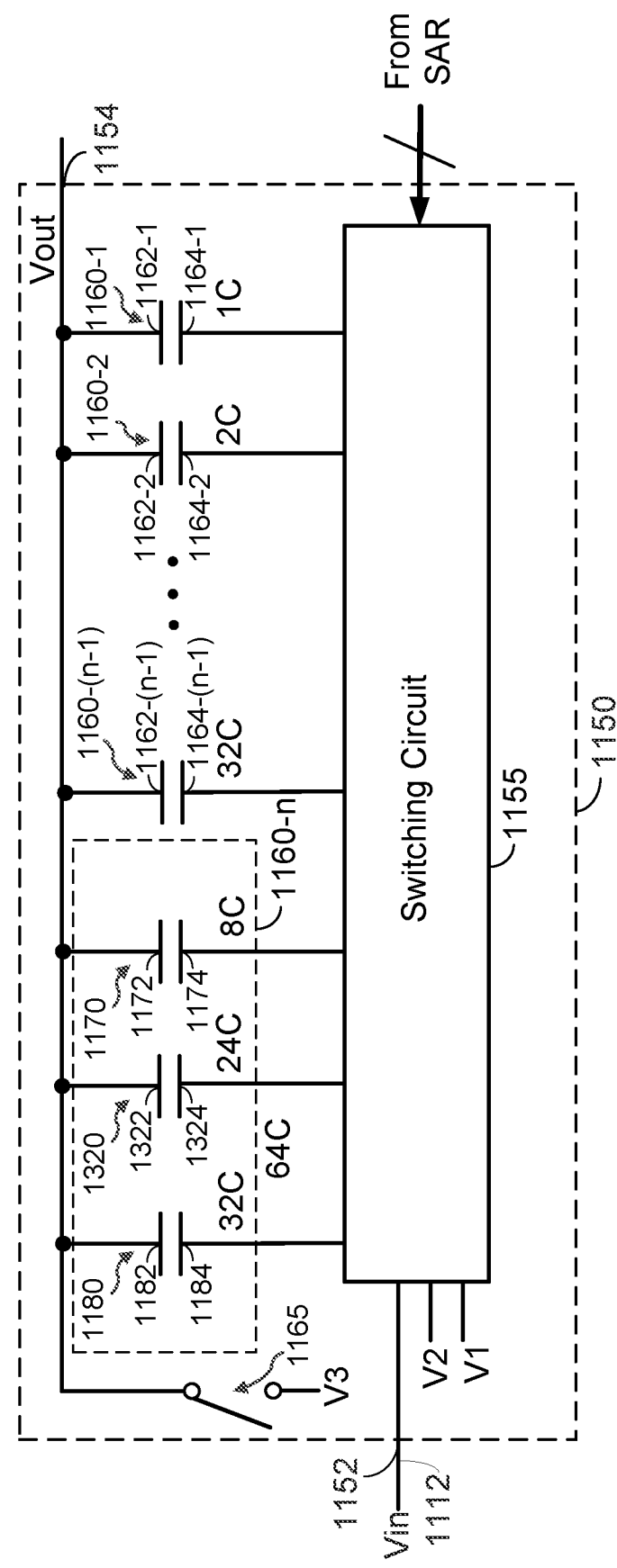
FIG. 13 shows an example of a SAR ADC including a capacitive DAC configured to provide a first threshold voltage and a second threshold voltage according to certain aspects of the present disclosure.

It is to be appreciated that the SAR ADC 1110 is not limited to one threshold voltage. For example, the capacitive DAC 1150 may be configured to provide a second threshold voltage by further splitting the MSB capacitor 1160-$n$ into three capacitors. In this regard, FIG. 13 shows an example in which the capacitive DAC 1150 is configured to provide a first threshold and a second threshold voltage for input-adaptive analog-to-digital conversion according to certain aspects. For ease of illustration, the comparator 1130 and the SAR 1140 are not explicitly shown in FIG. 13.

In this example, the MSB capacitor 1160-$n$ includes the first capacitor 1170 and the second capacitor 1180 discussed above with reference to FIG. 11 and further includes a third capacitor 1320. Thus, in this example, the capacitance of the MSB capacitor 1160-$n$ is split between the first capacitor 1170, the second capacitor 1180, and the third capacitor 1320. The first capacitor 1170 may be used to provide the first threshold voltage, and the first capacitor 1170 and the third capacitor 1320 may be combined to provide the second threshold voltage. In this example, the sum of the capacitance of the first capacitor 1170, the capacitance of the second capacitor 1180, and the capacitance of the third capacitor 1320 is equal the MSB capacitance, which is equal to $2^{n-1}$ times the unit capacitance, or approximately the sum of the capacitances of the lower-order capacitors 1160-1 to 1160-($n-1$).

The third capacitor 1320 has a first terminal 1322 coupled to the output 1154 of the capacitive DAC 1150 and a second terminal 1324 coupled to the switching circuit 1155. In this example, the capacitance of the first capacitor 1170 may be sized to provide the first threshold voltage. The capacitance of the third capacitor 1320 may be sized such that the combined capacitances of the first capacitor 1170 and the third capacitor 1320 provide the second threshold voltage. In the example shown in FIG. 13, the capacitance of the first capacitor 1170 is 8C and the capacitance of the third capacitor 1320 is 24C. However, it is to be appreciated that the present disclosure is not limited to this example, and that the first capacitor 1170 may have another capacitance and the third capacitor 1320 may have another capacitance (e.g., depending on the desired first and second threshold voltages).

The SAR ADC 1110 may convert the analog input voltage Vin at the input 1112 into a digital signal at the output 1115 in an analog-to-digital conversion operation based on the input-adaptive approach illustrated in FIG. 10. During the sampling phase, the SAR 1140 closes the switch 1165 and causes the switching circuit 1155 to couple the second terminals 1164-1 to 1164-($n-1$), 1174, 1184, and 1324 of the capacitors 1160-1 to 1160-($n-1$), 1170, 1180, and 1320 to the input 1152 of the capacitive DAC 1150 to sample the input voltage Vin.

At the start of the conversion phase, the SAR 1140 opens the switch 1165. To compare the sampled input voltage Vin with the first threshold voltage, the SAR 1140 causes the switching circuit 1155 to couple the second terminal 1174 of the first capacitor 1170 to the second voltage V2 (e.g., Vref) and couple the second terminals 1164-1 to 1164-($n-1$), 1324, and 1184 of the capacitors 1160-1 to 1160-($n-1$), 1320, and 1180 to the first voltage V1 (e.g., ground). This causes the output voltage Vout of the capacitive DAC 1150 to be approximately equal to V3+Vth1−Vin, where Vth1 is the first threshold voltage set by the capacitance of the first capacitor 1170. The comparator 1130 compares the output voltage Vout of the capacitive DAC 1150 with the third voltage V3 in this example, and outputs a compare signal based on the comparison. In this example, the compare signal has the first logic value (e.g., one) if the sampled input voltage Vin is greater than the first threshold voltage, and the compare signal has the second logic value (e.g., zero) if the sampled input voltage Vin is less than the first threshold voltage.

The SAR 1140 may then determine whether to resolve the last m bits of the digital signal based on the compare signal. If the control signal indicates the input voltage is less than the first threshold voltage, then the SAR 1140 may cause the switching circuit 1155 to switch the second terminal 1174 of the first capacitor 1170 to the first voltage V1 and resolve the last m bits $b_{m-1}$ to $b_0$ of the digital signal in the manner discussed above with reference to FIG. 11. After the last m bits $b_{m-1}$ to $b_0$ of the digital signal have been resolved, the SAR 1140 may output the resolved bits $b_{m-1}$ to $b_0$ at the output 1115 of the SAR ADC 1110. The SAR 1140 may also output zero for each of the higher-order bits $b_{n-1}$ to $b_m$.

If the control signal indicates the input voltage is greater than the first threshold voltage, then the SAR 1140 may compare the input voltage with the second threshold voltage. To do this, the SAR 1140 causes the switching circuit 1155 to couple the second terminal 1324 of the third capacitor 1320 to the second voltage V2 (e.g., Vref) so that the second terminals 1174 and 1324 of the first and third capacitors 1170 and 1320 are both coupled to the second voltage V2. This causes the output voltage Vout of the capacitive DAC 1150 to be approximately equal to V3+Vth2−Vin, where Vth2 is the second threshold voltage set by the combined capacitances of the first capacitor 1170 and the third capacitor 1320. The comparator 1130 compares the output voltage Vout of the capacitive DAC 1150 with the third voltage V3 in this example, and outputs a compare signal based on the comparison. In this example, the compare signal has the first logic value (e.g., one) if the sampled input voltage Vin is greater than the second threshold voltage, and the compare signal has the second logic value (e.g., zero) if the sampled input voltage Vin is less than the second threshold voltage.

The SAR 1140 may then determine whether to resolve the last k bits of the digital signal based on the compare signal. If the control signal indicates the input voltage is less than the second threshold voltage, then the SAR 1140 may cause the switching circuit 1155 to switch the second terminals 1174 and 1324 of the first and third capacitors 1170 and 1320 to the first voltage V1 (e.g., ground potential) and resolve the last k bits $b_{k-1}$ to $b_0$ of the digital signal. The SAR 1140 may resolve the last k bits in the manner discussed in which the conversion starts at bit $b_{k-1}$ where k is greater than m. For example, for each of the last k bits $b_{k-1}$ to $b_0$, the SAR 1140 may cause the switching circuit 1155 to couple the second terminal 1164-1 to 1164-($k-1$) of the respective one of the capacitors 1160-1 to 1160-($k-1$) to the second voltage V2 (e.g., Vref), and resolve the bit value of the bit based on the compare signal from the comparator 1130 (e.g., resolve a bit value of one if the compare signal has the first logic value (e.g., one) and resolve a bit value of zero if the compare signal has the second logic value (e.g., zero)). After the last k bits $b_{k-1}$ to $b_0$ of the digital signal have been resolved, the SAR 1140 may output the resolved bits $b_{k-1}$ to $b_0$ at the output 1115 of the SAR ADC 1110. The SAR 1140 may also output a bit value of zero for each of the bits $b_{n-1}$ to $b_m$ having a higher order than the k bits $b_{k-1}$ to $b_0$.

If the control signal indicates that the input voltage is greater than the second threshold voltage, then the SAR 1140 may resolve all n bits over n conversion cycles. To resolve the MSB $b_{n-1}$, the SAR 1140 causes the switching circuit 1155 to couple the second terminal 1184 of the second capacitor 1180 to the second voltage V2 (e.g., Vref) so that the second terminals 1174, 1184, and 1324 of the first, second, and third capacitors 1170, 1180, and 1320 are all coupled to the second voltage V2. The second terminals 1164-1 to 1164-(n−1) of the lower-order capacitors 1160-1 to 1160-(n−1) are left coupled to the first voltage V1. Thus, the switching circuit 1155 combines the first, second, and third capacitors 1170, 1180, and 1320 to provide the MSB capacitor for resolving the MSB $b_{n-1}$.

The SAR 1140 then resolves the MSB $b_{n-1}$ based on the compare signal. If the compare signal has the first logic value (e.g., one) indicating the sampled input voltage Vin is greater than ½Vref, then the SAR 1140 resolves the MSB $b_{n-1}$ to a bit value of one. In this case, the SAR 1140 leaves the second terminals 1174, 1184, and 1324 of the first, second, and third capacitors 1170, 1180, and 1320 coupled to the second voltage V2. If, on the other hand, the compare signal has the second logic value (e.g., zero) indicating the sampled input voltage Vin is less than ½Vref, then the SAR 1140 resolves the MSB $b_{n-1}$ to a bit value of zero. In this case, the SAR 1140 may cause the switching circuit 1155 to switch the second terminals 1174, 1184, 1324 of the first, second, and third capacitors 1170, 1180, and 1320 to the first voltage V1. The SAR 1140 may then resolve the remaining bits $b_{n-2}$ to $b_0$ in the manner discussed above with reference to FIG. 11. After all n bits $b_{n-1}$ to $b_0$ of the digital signal have been resolved, the SAR 1140 may output the resolved bits $b_{n-1}$ to $b_0$ at the output 1115 of the SAR ADC 1110.

Figure 14:
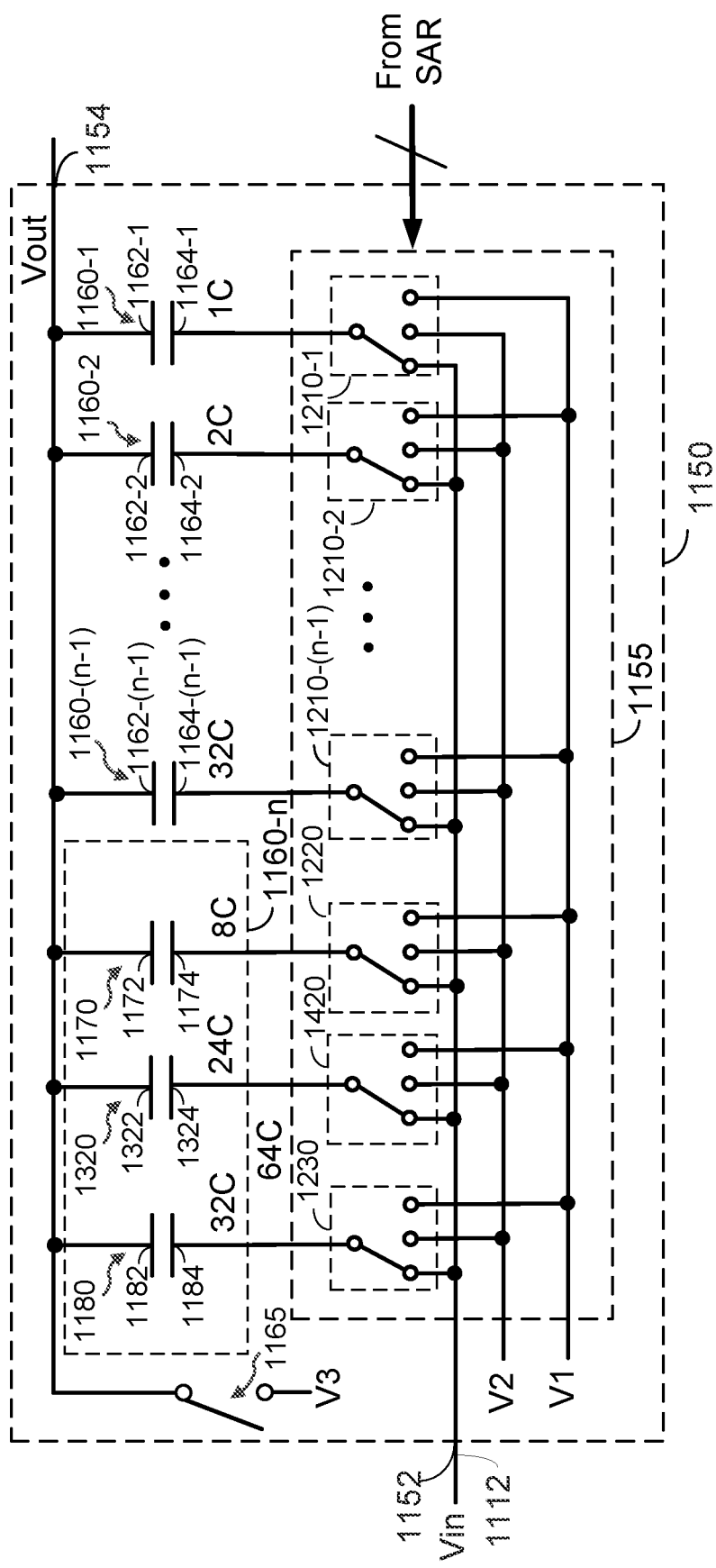
FIG. 14 shows another exemplary implementation of a switching circuit according to certain aspects of the present disclosure.

FIG. 14 shows an exemplary implementation of the switching circuit 1155 according to certain aspects. In this example, the switching circuit 1155 further includes a third switch 1420 coupled to the second terminal 1324 of the third capacitor 1320, the input 1152, the first voltage V1, and the second voltage V2. In operation, the third switch 1420 is configured to receive a third control signal from the SAR 1140 and selectively couple the second terminal 1324 of the third capacitor 1320 to the input 1152, the second voltage V2, or the first voltage V1 based on the third control signal. For case of illustration, the individual connection between the third switch 1420 and the SAR 1140 is not explicitly shown in FIG. 14.

Since the first switch 1220, the second switch 1230, and the third switch 1420 are controlled by separate control signals, the SAR 1140 can independently switch the first capacitor 1170, the second capacitor 1180, and the third capacitor 1320. The independent control of the switches 1220, 1230, and 1420 allows the SAR 1140 to use the first capacitor 1170 to provide the threshold voltage, combine the first capacitor 1170 and the third capacitor 1320 to provide the second threshold voltage, and combine the first capacitor 1170, the second capacitor 1180, and the third capacitor 1320 to provide the MSB capacitance for resolving the MSB $b_{n-1}$.

It is to be appreciated that the present disclosure is not limited to two thresholds. For example, the capacitive DAC 1150 may be configured to provide a third threshold by further splitting the MSB capacitor 1160-n into four capacitors.

Figure 15:
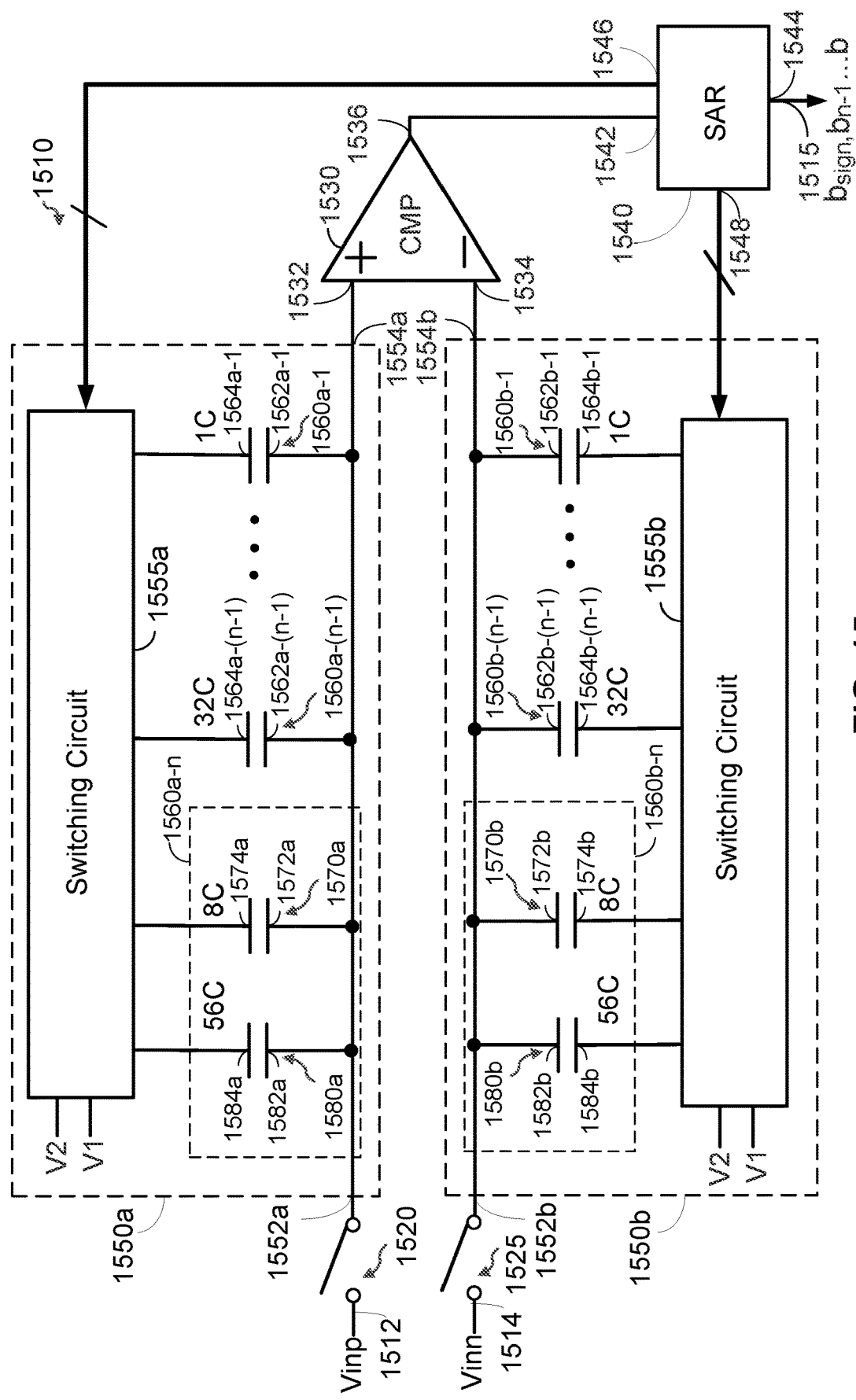
FIG. 15 shows an example of a differential SAR ADC including a first capacitive DAC and a second capacitive DAC configured to provide a threshold voltage according to certain aspects of the present disclosure.

Aspects of the present disclosure may also be implemented in a differential SAR ADC. In this regard, FIG. 15 shows an example of a differential SAR ADC 1510 according to certain aspects. The SAR ADC 1510 includes a first capacitive DAC 1550a, a second capacitive DAC 1550b, a comparator 1530, a SAR 1540 (also referred to as SAR logic), a first switch 1520, and a second switch 1525. The SAR ADC 1110 is configured to receive a first analog input voltage Vinp at a first input 1512, receive a second analog input voltage Vinn at a second input 1514, convert the difference between the first input voltage Vinp and the second input voltage Vinn into a digital signal, output the digital signal at an output 1515.

In this example, the first switch 1520 is coupled between the first input 1512 and an input 1552a of the first capacitive DAC 1550a, and the second switch 1525 is coupled between the second input 1514 and an input 1552b of the second capacitive DAC 1550b. The comparator 1530 has a first input 1532 coupled to an output 1554a of the first capacitive DAC 1550a, and a second input 1534 coupled to an output 1554b of the second capacitive DAC 1550b. The SAR 1540 has an input 1542 coupled to an output 1536 of the comparator 1530, a first output 1544 coupled to the output 1515 of the SAR ADC 1510, a second output 1546 coupled to the first capacitive DAC 1550a, and a third output 1548 coupled to the second capacitive DAC 1550b.

In the example in FIG. 15, the first capacitive DAC 1550a includes first binary-weighted capacitors 1560a-1 to 1560a-n. The capacitors 1560a-1 to 1560a-n have binary-weighted capacitances, in which each of the capacitors 1560-1 to 1560-n corresponds to a respective one of the bits $b_{n-1}$ to $b_0$ of the digital signal. The capacitor 1560a-1 has the lowest-weighted capacitance and the capacitor 1560a-n has the highest weighted capacitance. The capacitor 1560a-n with the highest weighted capacitance among the capacitors 1560a-1 to 1560a-n corresponds to the MSB. In this regard, the capacitor 1560a-n may be referred to as the MSB capacitor, and the capacitors 1560a-1 to 1560a-(n−1) may be referred to as lower-order capacitors. In the example in FIG. 15, each of the capacitors 1560a-2 to 1560a-n has a capacitance that is approximately twice the capacitance of the capacitor to the immediate right. The MSB capacitor 1560a-n has a capacitance equal to $2^{n-1}$ times the unit capacitance where a unit capacitance is the capacitance of the capacitor 1560a-1 with the smallest weight, or a capacitance approximately equal to the sum of the capacitances of the lower-order capacitors 1560-1 to 1560-(n−1).

In this example, the MSB capacitor 1560a-n includes a first capacitor 1570a and a second capacitor 1580a, in which the capacitance of the MSB capacitor 1560a-n is split between the first capacitor 1570a and the second capacitor 1580a. The first capacitor 1570a is used to provide a threshold voltage. The capacitance of the first capacitor 1570a may be sized to provide a desired threshold voltage. For example, the capacitance of the first capacitor 1570a may be larger for a larger threshold voltage, and smaller for a smaller threshold voltage. In the example shown in FIG. 15, the capacitance of the first capacitor 1570a is 8C (i.e., eight times the unit capacitance). However, it is to be appreciated that the present disclosure is not limited to this example. The capacitance of the second capacitor 1580a is sized such that the sum of the capacitance of the first capacitor 1570a and the capacitance of the second capacitor 1580a is equal to the capacitance of the MSB capacitor 1560a-n, which is the largest of the binary-weighted capacitor. This allows the first capacitor 1570a and the second capacitor 1580a to be combined to provide the MSB capacitance for resolving the MSB $b_{n-1}$. FIG. 15 shows exemplary capacitances of the second capacitor 1580a and the first capacitor 1570a for the example where the number of bits in seven. In this example, the sum of the capacitances of the first and second capacitors 1570a and 1580a is 64 times the unit capacitance. However, it is to be appreciated that the present disclosure is not limited to this example.

Each of the lower-order capacitors 1560a-1 to 1560-(n−1) has a first terminal 1562-1 to 1562-(n−1) coupled to the input 1552a and the output 1554a of the first capacitive DAC 1550a. Each of the lower-order capacitors 1560a-1 to 1560-(n−1) also has a second terminal 1564-1 to 1564-(n−1). The first capacitor 1570a has a first terminal 1572a coupled to the input 1552a and the output 1554a of the first capacitive DAC 1550a. The first capacitor 1570a also has a second terminal 1574a. The second capacitor 1580a has a first terminal 1582a coupled to the input 1552a and the output 1554a of the first capacitive DAC 1550a. The second capacitor 1580a also has a second terminal 1574a.

In the example shown in FIG. 15, the first capacitive DAC 1550a also includes a first switching circuit 1555a coupled to the second terminal 1564a-1 to 1564a-(n−1) of each of the lower-order the capacitors 1560a-1 to 1560a-(n−1), the second terminal 1574a of the first capacitor 1570a, and the second terminal 1584a of the second capacitor 1580a. The first switching circuit 1555a is also coupled to a first voltage V1 and a second voltage V2. The difference between the first voltage V1 and the second voltage V2 provides a reference voltage Vref (i.e., V1−V2=Vref). For example, the second voltage V2 may be at ground potential and the first voltage V1 may be equal to the reference voltage Vref. However, it is to be appreciated the present disclosure is not limited to this example.

The first switching circuit 1555a may be configured to switch the second terminal 1564a-1 to 1564a-(n−1), 1574a, 1584a of each the capacitors 1560a-1 to 1560a-(n−1), 1570a, and 1580a between the first voltage V1 and the second voltage V2 based on one or more control signals from the SAR 1440. In other words, the first switching circuit 1155a may be configured to selectively couple the second terminal 1564a-1 to 1564a-(n−1), 1574a, 1584a of each the capacitors 1560a-1 to 1560a-(n−1), 1570a, and 1580a to the first voltage V1, or the second voltage V2 based on the one or more control signals.

The second capacitive DAC 1550b includes second binary-weighted capacitors 1560b-1 to 1560b-n. The capacitors 1560b-1 to 1560b-n have binary-weighted capacitances, in which each of the capacitors 1560b-1 to 1560b-n corresponds to a respective one of the bits $b_{n-1}$ to $b_0$ of the digital signal. The capacitor 1560b-1 has the lowest-weighted capacitance, and the capacitor 1560b-n has the highest weighted capacitance. In some implementations, each of the capacitors 1560b-1 to 1560b-n may have the same capacitance as a corresponding one of the capacitors 1560a-1 to 1560a-n in the first capacitive DAC 1550a. The capacitor 1560b-n with the highest weighted capacitance among the capacitors 1560b-1 to 1560b-n corresponds to the MSB. In this regard, the capacitor 1560b-n may be referred to as the MSB capacitor, and the capacitors 1560b-1 to 1560b-(n−1) may be referred to as lower-order capacitors since each of the lower-order capacitors has a smaller capacitance (i.e., lower weight) than the MSB capacitor 1560-n. The MSB capacitor 1560a-n in the first capacitive DAC 1550a may also be referred to as the first MSB capacitor and the MSB capacitor 1560b-n in the second capacitive DAC 1550b may also be referred to as the second MSB capacitor. Also, the lower-order capacitors 1560a-1 to 1560a-(n−1) in the first capacitive DAC 1550a may also be referred to as the first lower-order capacitors and the lower-order capacitors 1560b-1 to 1560b-(n−1) in the second capacitive DAC 1550b may also be referred to as the second lower-order capacitors.

In this example, the MSB capacitor 1560b-n includes a third capacitor 1570b and a fourth capacitor 1580b, in which the capacitance of the MSB capacitor 1560b-n is split between the third capacitor 1570b and the fourth capacitor 1580b. The third capacitor 1570b is used to provide the threshold voltage. The capacitance of the fourth capacitor 1580b is sized such that the sum of the capacitance of the third capacitor 1570b and the capacitance of the fourth capacitor 1580b is equal to the capacitance of the MSB capacitor 1560b-n, which is the largest of the binary-weighted capacitor. This allows the third capacitor 1570b and the fourth capacitor 1580b to be combined to provide the MSB capacitance for resolving the MSB $b_{n-1}$. FIG. 15 shows exemplary capacitances of the fourth capacitor 1580b and the third capacitor 1570b for the example where the number of bits in seven. However, it is to be appreciated that the present disclosure is not limited to this example. The first capacitor 1570a and the third capacitor 1570b may have the same capacitance, and the second capacitor 1580a and the fourth capacitor 1580b may have the same capacitance.

Each of the lower-order capacitors 1560b-1 to 1560-(n−1) has a first terminal 1562-1 to 1562-(n−1) coupled to the input 1552b and the output 1554b of the second capacitive DAC 1550b. Each of the lower-order capacitors 1560b-1 to 1560-(n−1) also has a second terminal 1564-1 to 1564-(n−1). The third capacitor 1570b has a first terminal 1572b coupled to the input 1552b and the output 1554b of the second capacitive DAC 1550b. The third capacitor 1570b also has a second terminal 1574b. The fourth capacitor 1580b has a first terminal 1582b coupled to the input 1552b and the output 1554b of the second capacitive DAC 1550b. The fourth capacitor 1580b also has a second terminal 1584b.

In the example shown in FIG. 15, the second capacitive DAC 1550b also includes a second switching circuit 1555b coupled to the second terminal 1564b-1 to 1564b-(n−1) of each of the lower-order the capacitors 1560b-1 to 1560b-(n−1), the second terminal 1574b of the third capacitor 1570b, and the second terminal 1584b of the fourth capacitor 1580b. The second switching circuit 1555b is also coupled to the first voltage V1 and the second voltage V2.

The second switching circuit 1555b may be configured to switch the second terminal 1564b-1 to 1564b-(n−1), 1574b, 1584b of each the capacitors 1560b-1 to 1560b-(n−1), 1570b, and 1580b between the first voltage V1 and the second voltage V2 based on one or more control signals from the SAR 1440. In other words, the second switching circuit 1155b may be configured to selectively couple the second terminal 1564b-1 to 1564b-(n−1), 1574b, 1584b of each the capacitors 1560b-1 to 1560b-(n−1), 1570b, and 1580b the first voltage V1 or the second voltage V2 based on the one or more control signals.

The SAR ADC 1510 is configured to convert the difference between the first input voltage Vinp and the second input voltage Vinn at the inputs 1512 and 1514 into a digital signal at the output 1515 in an analog-to-digital conversion operation that includes a sampling phase and a conversion phase. During the sampling phase, the SAR 1540 causes the first switching circuit 1555a to couple the second terminals 1564a-1 to 1564a-(n−1), 1574a, and 1584a of the capacitors 1560a-1 to 1560a-(n−1), 1570a, and 1580a to the first voltage V1, and causes the second switching circuit 1555b to couple the second terminals 1564b-1 to 156b-(n−1), 1574b, and 1584b of the capacitors 1560b-1 to 1560b-(n−1),

1570b, and 1580b to the first voltage V1. The SAR 1540 also closes the first and second switches 1520 and 1525 to sample the first and second input voltages Vinp and Vinn, respectively. In this example, the first capacitive DAC 1550a samples the first input voltage Vinp, and the second capacitive DAC 1550b samples the second input voltage Vinn.

At the start of the conversion phase, the SAR 1540 opens the first and second switches 1520 and 1525. As a result, the first input voltage Vinp is held at the output 1554a of the first capacitive DAC 1550a and the second input voltage Vinn is held at the output 1554b of the second capacitive DAC 1550b. The comparator 1530 compares the first input voltage Vinp with the second input voltage Vinn, and outputs a compare signal based on the comparison. For example, the comparator 1530 may output a first logic value (e.g., one) when the first input voltage Vinp is greater than the second input voltage Vinn, and output a second logic value (e.g., zero) when the second input voltage Vinn is greater than the first input voltage Vinp.

The SAR 1540 may then determine a sign bit $b_{sign}$ based the compare signal indicating whether the first input voltage Vinp is greater than the second input voltage Vinn. For example, the sign bit may have a first logic value (e.g., one) if the compare signal indicates the first input voltage Vinp is greater than the second input voltage Vinn, and a second logic value (e.g., zero) if second input voltage Vinn is greater than the first input voltage Vinp.

If the compare signal indicates the first input voltage Vinp is greater than the second input voltage Vinn, then the SAR 1540 compares the difference between the first input voltage Vinp and the second input voltage Vinn (i.e., Vinp−Vinn) with the threshold voltage using the first capacitor 1570a in the first capacitive DAC 1550a. If the compare signal indicates the second input voltage Vinn is greater than the first input voltage Vinp, then the SAR 1540 compares the difference between the second input voltage Vinn and the first input voltage Vinp (i.e., Vinn−Vinp) with the threshold voltage using the third capacitor 1570b in the second capacitive DAC 1550b. Exemplary operations for comparing the difference between the first input voltage Vinp and the second input voltage Vinn (i.e., Vinp−Vinn) with the threshold voltage are discussed below according to certain aspects.

To compare the difference between the first input voltage Vinp and the second input voltage Vinn (i.e., Vinp−Vinn) with the threshold voltage, the SAR 1540 causes the switching circuit 1555a to couple the second terminal 1574a of the first capacitor 1570a to the second voltage V2 while the second terminals of the other capacitors 1560a-1 to 1560a-(n−1), 1560b-1 to 1560b-(n−1), 1570b, 1580a, and 1580b remain coupled to the first voltage V1. This causes the output 1554a of the first capacitive DAC 1550a to be approximately equal to Vinp−Vth where Vth is the threshold voltage set by the capacitance of the first capacitor 1570a. The output 1554b of the second capacitive DAC 1550b stays at the second input voltage Vinn. The comparator 1530 compares the outputs 1554a and 1554b of the capacitive DACs 1550a and 1550b, and outputs a compare signal based on the comparison. In this example, the compare signal has the first logic value (e.g., one) if the first input voltage Vinp is greater than the second input voltage Vinn by more than threshold voltage, and the compare signal has the second logic value (e.g., zero) if the first input voltage is greater than the second input voltage Vinn by less than the threshold voltage.

The SAR 1540 may then determine whether to resolve all n bits of the digital signal or resolve the last m bits of the digital signal based on the compare signal. If the control signal indicates the difference between the first input voltage Vinp and the second input voltage Vinn is greater than the threshold voltage, then the SAR 1540 may resolve all n bits. If the control signal indicates the difference between the first input voltage Vinp and the second input voltage Vinn is less than the threshold voltage, then the SAR 1140 may resolve the last m bits where m is less than n.

To resolve the MSB $b_{n-1}$ when the difference between the first input voltage Vinp and the second input voltage Vinn is greater than the threshold voltage, the SAR 1540 causes the first switching circuit 1555a to couple the second terminal 1584a of the second capacitor 1580a to the second voltage V2 so that the second terminals 1574a and 1584a of first and second capacitors 1570a and 1580a are both coupled to the second voltage V2. Thus, the first and second capacitors 1570a and 1580a are combined to provide the MSB capacitor for resolving the MSB $b_{n-1}$.

The SAR 1540 then resolves the MSB $b_{n-1}$ based on the compare signal. If the compare signal has the first logic value (e.g., one), then the SAR 1540 resolves the MSB $b_{n-1}$ to a bit value of one. If, on the other hand, the compare signal has the second logic value (e.g., zero), then the SAR 1540 resolves the MSB $b_{n-1}$ to a bit value of zero. After resolving the MSB $b_{n-1}$, the SAR 1540 resolves the remaining bits $b_{n-2}$ to $b_0$.

Switching operations for resolving the remaining bits $b_{n-2}$ to $b_0$ are known in the art. In one example, to resolve bit $b_{n-2}$, the SAR 1540 causes the first switching circuit 1555a to couple the second terminal 1564a-(n−1) of the capacitor 1560a-(n−1) to the second voltage V2 if the MSB $b_{n-1}$ is one or causes the second switching circuit 1555b to couple the second terminal 1564b-(n−1) of the capacitor 1560b-(n−1) to the second voltage if the MSB $b_{n-1}$ is zero. The SAR 1540 then resolves the bit $b_{n-2}$ based on the compare signal. If the compare signal has the first logic value (e.g., one), then the SAR 1140 resolves the bit $b_{n-2}$ to a bit value of one. If, on the other hand, the compare signal has the second logic value (e.g., zero), then the SAR 1540 resolves the bit $b_{n-2}$ to a bit value of zero.

The SAR 1140 may repeat the above process for each of the remaining bits $b_{n-3}$ to $b_0$ to resolve the remaining bits $b_{n-3}$ to $b_0$. For example, for each of the $b_{n-3}$ to $b_0$, the SAR 1540 may cause the first switching circuit 1555a to couple the second terminal of the respective one of the capacitors 1560a-1 to 1560a-(n−3) to the second voltage V2 if the previous resolved bit is one or cause the second switching circuit 1555b to couple the second terminal of the respective one of the capacitors 1560b-1 to 1560b-(n−3) to the second voltage V2 if previous resolved bit is zero, and resolve the bit based on the compare signal (e.g., resolve a bit value of one if the compare signal has the first logic value, and resolve a bit value of zero if the compare signal has the second logic value).

After all n bits $b_{n-1}$ to $b_0$ of the digital signal have been resolved, the SAR 1540 may output the resolved bits $b_{n-1}$ to $b_0$ at the output 1515 of the SAR ADC 1510, in which the resolved bits $b_{n-1}$ to $b_0$. The SAR 1540 may also output the sign bit $b_{sign}$.

As discussed above, if the difference between the first input voltage Vinp and the second input voltage Vinn is less than the threshold voltage, then the SAR 1540 may resolve the last m bits where m is less than n. The SAR 1540 may control the switching circuits 1555a and 1555b to resolve the last m bits in the manner discussed above for the full n bits except starting the conversion at bit $b_{m-1}$ instead of the MSB. For example, the SAR 1540 may cause the switching circuit 1555b to couple the second terminal 1564b-(m−1) of the capacitor 1560b-(m−1) to the second voltage V2, and resolve the bit $b_{m-1}$ based on the compare signal (i.e., resolve a bit value of one if the compare signal has the first logic value and resolve a bit value of zero if the compare signal has the second logic value). The SAR 1540 may then resolve the remaining bits $b_{m-2}$ to $b_0$. For example, for each of the $b_{m-2}$ to $b_0$, the SAR 1540 may cause the first switching circuit 1555a to couple the second terminal of the respective one of the capacitors 1560a-1 to 1560a-(m−2) to the second voltage V2 if the previous resolved bit is one or cause the second switching circuit 1555b to couple the second terminal of the respective one of the capacitors 1560b-1 to 1560b-(m−2) to the second voltage V2 if previous resolved bit is zero, and resolve the bit based on the compare signal (e.g., resolve a bit value of one if the compare signal has the first logic value, and resolve a bit value of zero if the compare signal has the second logic value). After the last m bits $b_{m-1}$ to $b_0$ of the digital signal have been resolved, the SAR 1540 may output the resolved bits $b_{m-1}$ to $b_0$ at the output 1515 of the SAR ADC 1510. The SAR 1540 may also output zero for each of the higher-order bits $b_{n-1}$ to $b_m$ and output the sign bit $b_{sign}$.

The exemplary operation discussed above are for the case where the first input voltage Vinp is greater than the second input voltage Vinn. If the second input voltage Vinn is greater than the first input voltage Vinp, then the SAR 1540 compares the difference between the second input voltage Vinn and the first input voltage Vinp (i.e., Vinn−Vinp) with the threshold voltage using the third capacitor 1570b in the second capacitive DAC 1550b in the manner discussed above in which the roles the first capacitive DAC 1550a and the second capacitive DAC 1550b are reversed.

For example, to compare the difference between the second input voltage Vinn and the first input voltage Vinp with the threshold voltage, the SAR 1540 causes the switching circuit 1555b to couple the second terminal 1574b of the third capacitor 1570b to the second voltage V2 while the second terminals of the other capacitors 1560a-1 to 1560a-(n−1), 1560b-1 to 1560b-(n−1), 1570a, 1580a, and 1580b remain coupled to the first voltage V1. This causes the output 1554b of the second capacitive DAC 1550b to be approximately equal to Vinn−Vth where Vth is the threshold voltage set by the capacitance of the third capacitor 1570b. The output 1554a of the first capacitive DAC 1550a stays at the first input voltage Vinp. The comparator 1530 compares the outputs 1554a and 1554b of the capacitive DACs 1550a and 1550b, and outputs a compare signal based on the comparison. If the compare signal indicates the difference between the second input voltage Vinn and the first input voltage Vinp is greater than the threshold voltage, then SAR 1540 resolves all n bits of the digital signal. If the compare signal indicates the difference between the second input voltage Vinn and first input voltage Vinp is less than the threshold voltage, then the SAR 1540 resolves the last m bits of the digital signal.

To resolve the MSB $b_{n-1}$ when the difference between the second input voltage Vinn and the first input voltage Vinp is greater than the threshold voltage, the SAR 1540 causes the second switching circuit 1555b to couple the second terminal 1584b of the fourth capacitor 1580b to the second voltage V2 so that the second terminals 1574b and 1584b of third and fourth capacitors 1570b and 1580b are both coupled to the second voltage V2. Thus, the third and fourth capacitors 1570b and 1580b are combined to provide the MSB capacitor for resolving the MSB $b_{n-1}$.

The SAR 1540 then resolves the MSB $b_{n-1}$ based on the compare signal. If the compare signal has the second logic value, then the SAR 1540 resolves the MSB $b_{n-1}$ to a bit value of one. If, on the other hand, the compare signal has the first logic value, then the SAR 1540 resolves the MSB $b_{n-1}$ to a bit value of zero. After resolving the MSB $b_{n-1}$, the SAR 1540 resolves the remaining bits $b_{n-2}$ to $b_0$ (e.g., in the manner discussed above with the roles of the first capacitive DAC 1550a and the second capacitive DAC 1550 reversed). After all n bits $b_{n-1}$ to $b_0$ of the digital signal have been resolved, the SAR 1540 may output the resolved bits $b_{n-1}$ to $b_0$ at the output 1515 of the SAR ADC 1510, in which the resolved bits $b_{n-1}$ to $b_0$. The SAR 1540 may also output the sign bit $b_{sign}$.

If the difference between the second input voltage Vinn and the first input voltage Vinp is less than the threshold voltage, then the SAR 1540 may resolve the last m bits where m is less than n (e.g., in the manner discussed above with the roles of the first capacitive DAC 1550a and the second capacitive DAC 1550 reversed). After the last m bits $b_{m-1}$ to $b_0$ of the digital signal have been resolved, the SAR 1540 may output the resolved bits $b_{m-1}$ to $b_0$ at the output 1515 of the SAR ADC 1510. The SAR 1540 may also output zero for each of the higher-order bits $b_{n-1}$ to $b_m$ and output the sign bit $b_{sign}$.

Figure 16:
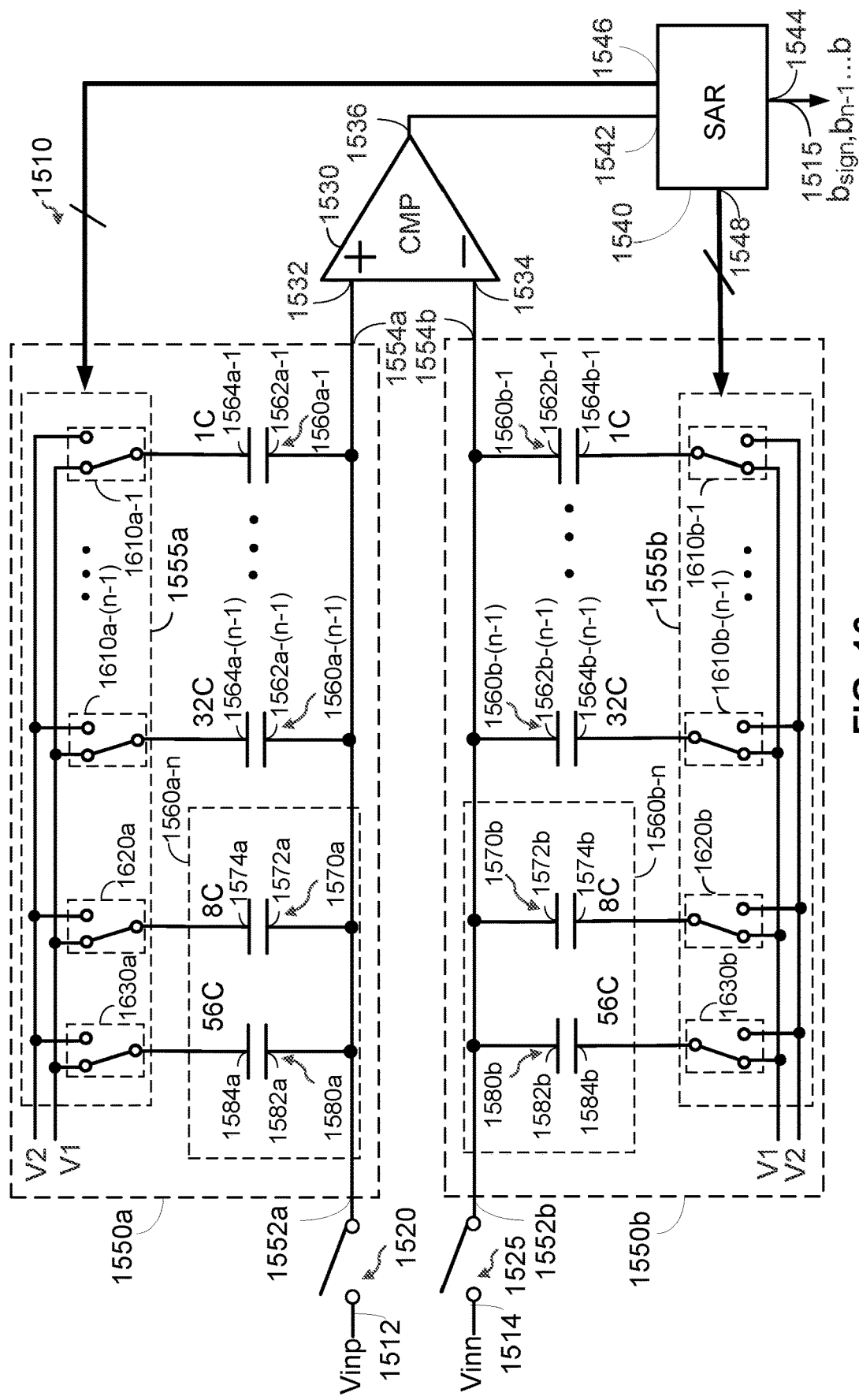
FIG. 16 shows an exemplary implementation of a first switching circuit and a second switching circuit according to certain aspects of the present disclosure.

FIG. 16 shows an exemplary implementation of the first and second switching circuits 1555a and 1555b according to certain aspects. In this example, the first switching circuit 1555a includes switches 1610a-1 to 1610a-(n−1) for independently switching the lower-order capacitors 1560a-1 to 1560a-(n−1), in which each of the switches 1610a-1 to 1610a-(n−1) is coupled to the second terminal 1564a-1 to 1564a-(n−1) of a respective one of the capacitors 1560a-1 to 1560a-(n−1), the first voltage V1, and the second voltage V2. In operation, each of the switches 1610a-1 to 1610a-(n−1) is configured to receive a respective control signal from the SAR 1540 and selectively couple the second terminal 1564a-1 to 1564a-(n−1) of the respective one of the capacitors 1560a-1 to 1560a-(n−1) to the second voltage V2 or the first voltage V1 based on the respective control signal.

The first switching circuit 1555a also includes a first switch 1620a and a second switch 1630a for independently switching the first capacitor 1570a and the second capacitor 1580a. The first switch 1620a is coupled to the second terminal 1574a of the first capacitor 1570a, the first voltage V1, and the second voltage V2. In operation, the first switch 1620a is configured to receive a first control signal from the SAR 1540 and selectively couple the second terminal 1574a of the first capacitor 1570a to the second voltage V2 or the first voltage V1 based on the first control signal.

The second switch 1630a coupled to the second terminal 1584a of the second capacitor 1580a, the first voltage V1, and the second voltage V2. In operation, the second switch 1630a is configured to receive a second control signal from the SAR 1540 and selectively couple the second terminal 1584a of the second capacitor 1580a to the second voltage V2 or the first voltage V1 based on the second control signal. Since the first switch 1620a and the second switch 1630a are controlled by separate control signals, the SAR 1540 is able to independently switch the first capacitor 1570a and the second capacitor 1580a.

In this example, the second switching circuit 1555b includes switches 1610b-1 to 1610b-(n−1) for independently switching the lower-order capacitors 1560b-1 to 1560b-(n−1), in which each of the switches 1610b-1 to 1610b-(n−1) is coupled to the second terminal 1564b-1 to 1564b-(n−1) of a respective one of the capacitors 1560b-1 to 1560b-(n−1), the first voltage V1, and the second voltage V2. In operation, each of the switches 1610b-1 to 1610b-(n−1) is configured to receive a respective control signal from the SAR 1540 and selectively couple the second terminal 1564b-1 to 1564b-(n−1) of the respective one of the capacitors 1560b-1 to 1560b-(n−1) to the second voltage V2 or the first voltage V1 based on the respective control signal.

The second switching circuit 1555b also includes a third switch 1620b and a fourth switch 1630b for independently switching the third capacitor 1570b and the fourth capacitor 1580b. The third switch 1620b is coupled to the second terminal 1574b of the third capacitor 1570b, the first voltage V1, and the second voltage V2. In operation, the third switch 1620b is configured to receive a third control signal from the SAR 1540 and selectively couple the second terminal 1574b of the third capacitor 1570b to the second voltage V2 or the first voltage V1 based on the third control signal.

The fourth switch 1630b coupled to the second terminal 1584b of the fourth capacitor 1580b, the first voltage V1, and the second voltage V2. In operation, the fourth switch 1630b is configured to receive a fourth control signal from the SAR 1540 and selectively couple the second terminal 1584b of the fourth capacitor 1580b to the second voltage V2 or the first voltage V1 based on the fourth control signal. Since the third switch 1620b and the fourth switch 1630b are controlled by separate control signals, the SAR 1540 is able to independently switch the third capacitor 1570b and the fourth capacitor 1580b.

Figure 17:
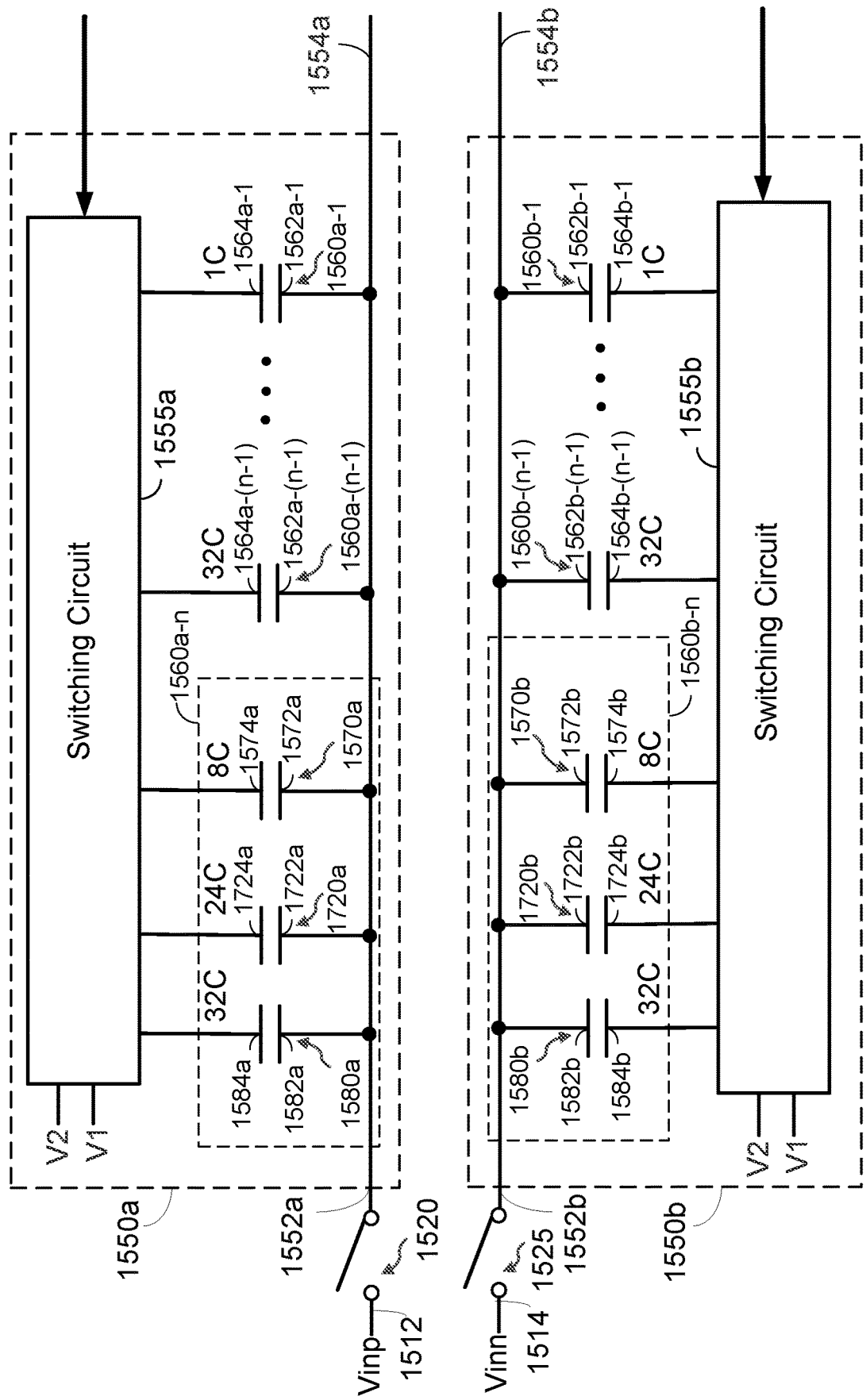
FIG. 17 shows an example of a differential SAR ADC including a first capacitive DAC and a second capacitive DAC configured to provide a first threshold voltage and a second threshold voltage according to certain aspects of the present disclosure.

It is to be appreciated that the SAR ADC 1510 is not limited to one threshold voltage. For example, the first and second capacitive DACs 1550a and 1550b may be configured to provide a second threshold voltage by further splitting the respective MSB capacitor 1560a-n and 1560b-n into three capacitors. In this regard, FIG. 17 shows an example in which each of the first and second capacitive DACs 1550a and 1550b is configured to provide a first threshold and a second threshold voltage for input-adaptive analog-to-digital conversion according to certain aspects. For case of illustration, the comparator 1530 and the SAR 1540 are not explicitly shown in FIG. 17.

In this example, the MSB capacitor 1560a-n in the first capacitive DAC 1550a includes the first capacitor 1570a and the second capacitor 1580a discussed above with reference to FIG. 15 and further includes a fifth capacitor 1720a. Thus, this example, the capacitance of the MSB capacitor 1560a-n is split between the first capacitor 1570a, the second capacitor 1580a, and the fifth capacitor 1720a. The first capacitor 1570a may be used to provide the first threshold voltage, and the first capacitor 1570a and the fifth capacitor 1720a may be combined to provide the second threshold voltage. In this example, the sum of the capacitances of the first capacitor 1570a, the second capacitor 1580a, and the fifth capacitor 1720a is equal to the MSB capacitance discussed above, which is equal to $2^{n-1}$ times the unit capacitance, or approximately equal to the sum of the capacitances of the lower-order capacitors 1560a-1 to 1560a-(n−1).

The fifth capacitor 1720a has a first terminal 1722a coupled to the output 1554a of the first capacitive DAC 1550a and a second terminal 1724a coupled to the first switching circuit 1555a. In this example, the capacitance of the first capacitor 1570a may be sized to provide the first threshold voltage. The capacitance of the fifth capacitor 1720a may be sized such that the combined capacitances of the first capacitor 1570a and the fifth capacitor 1720a provide the second threshold voltage. In the example shown in FIG. 17, the capacitance of the first capacitor 1570a is 8C and the capacitance of the fifth capacitor 1720a is 24C. However, it is to be appreciated that the present disclosure is not limited to this example, and that the first capacitor 1570a may have another capacitance and the fifth capacitor 1720a may have another capacitance (e.g., depending on the desired first and second threshold voltages).

In this example, the capacitance of the second capacitor 1580a is sized such that the sum of the capacitance of the first capacitor 1570a, the capacitance of the second capacitor 1580a, and the capacitance of the fifth capacitor 1720a is equal to the capacitance of the MSB capacitor 1560a-n, which is the largest of the binary-weighted capacitor among the first binary-weighted capacitors 1560a-1 to 1560a-n. This allows the first capacitor 1570a, the second capacitor 1580a, and the fifth capacitor 1720a to be combined to provide the MSB capacitance for resolving the MSB $b_{n-1}$. FIG. 17 shows exemplary capacitances of the first, second, and fifth capacitors 1570a, 1580a, and 1720a for the example where the number of bits in seven. However, it is to be appreciated that the present disclosure is not limited to this example.

In this example, the MSB capacitor 1560b-n in the second capacitive DAC 1550b includes the third capacitor 1570b and the fourth capacitor 1580b discussed above with reference to FIG. 15 and further includes a sixth capacitor 1720b. Thus, this example, the capacitance of the MSB capacitor 1560b-n is split between the third capacitor 1570b, the fourth capacitor 1580b, and the sixth capacitor 1720b. The third capacitor 1570b may be used to provide the first threshold voltage, and the third capacitor 1570b and the sixth capacitor 1720b may be combined to provide the second threshold voltage. In this example, the sum of the capacitances of the third capacitor 1570b, the fourth capacitor 1580b, and the sixth capacitor 1720b is equal to the MSB capacitance discussed above (e.g., $2^{n-1}$ times the unit capacitance).

The sixth capacitor 1720b has a first terminal 1722b coupled to the output 1554b of the second capacitive DAC 1550b and a second terminal 1724b coupled to the second switching circuit 155b. In this example, the capacitance of the third capacitor 1570b may be sized to provide the first threshold voltage. The capacitance of the sixth capacitor 1720b may be sized such that the combined capacitances of the third capacitor 1570b and the sixth capacitor 1720b provide the second threshold voltage.

In this example, the capacitance of the fourth capacitor 1580b is sized such that the sum of the capacitance of the third capacitor 1570b, the capacitance of the fourth capacitor 1580b, and the capacitance of the sixth capacitor 1720b is equal to the capacitance of the MSB capacitor 1560b-n, which is the largest of the binary-weighted capacitor among the second binary-weighted capacitors 1560b-1 to 1560b-n. This allows the third capacitor 1570b, the fourth capacitor 1580b, and the sixth capacitor 1720b to be combined to provide the MSB capacitance for resolving the MSB $b_{n-1}$.

The SAR ADC 1510 may convert the difference between the first input voltage Vinp and the second input voltage Vinn into a digital signal at the output 1515 in an analog-to-digital conversion operation based on the input-adaptive approach illustrated in FIG. 10. During the sampling phase, the SAR 1540 closes the switches 1520 and 1525 and causes the switching circuits 1555a and 1555b to couple the second terminals 1564a-1 to 1564a-(n−1), 1564b-1 to 1564b-(n−1), 1574a, 1574b, 1584a, 1584b, 1724a, and 1724b of the capacitors 1560a-1 to 1560a-(n−1), 1560b-a to 1560b-(n−1), 1570a, 1570b, 1580a, 1580b, 1720a, and 1720b to the first voltage V1.

At the start of the conversion phase, the SAR 1540 opens the switches 1520 and 1525 to hold the sampled input voltages Vinp and Vinn. The SAR 1540 then determines whether the first voltage Vinp is greater than or less than the second voltage Vinn (i.e., determines the sign of the difference between the first voltage Vinp and the second voltage Vinn) as discussed above with reference to FIG. 15.

If the first voltage Vinp is greater than the second voltage Vinn, then the SAR 1540 compares the difference between the first voltage Vinp and the second voltage Vinn with the first threshold voltage using the first capacitive DAC 1550*a*. If the second voltage Vinn is greater than the first voltage Vinp, then the SAR 1540 compares the difference between the second voltage Vinn and the first voltage Vinp with the first threshold voltage using the second capacitive DAC 1550*b*. Exemplary operations for comparing the difference between the first input voltage Vinp and the second input voltage Vinn with the first threshold voltage are discussed below according to certain aspects.

To compare the difference between the first input voltage Vinp and the second input voltage Vinn with the first threshold voltage, the SAR 1540 causes the switching circuit 1650*a* to couple the second terminal 1574*a* of the first capacitor 1570*a* to the second voltage V2. The second terminals of the other capacitors 1560*a*-1 to 1560*a*-(n−1), 1560*b*-*a* to 1560*b*-*n*, 1570*b*, 1580*a*, 1580*b*, 1720*a*, and 1720*b* are left coupled to the first voltage V1. This causes the output 1554*a* of the first capacitive DAC 1550*a* to be approximately equal to Vinp−Vth1 where Vth1 is the first threshold voltage set by the capacitance of the first capacitor 1570*a*.

If the control signal indicates the difference between the first input voltage Vinp and the second input voltage Vinn is less than the first threshold voltage, then the SAR 1540 may resolve the last m bits over m conversion cycles, as discussed above with reference to FIG. 15. After the last m bits $b_{m-1}$ to $b_0$ of the digital signal have been resolved, the SAR 1540 may output the resolved bits $b_{m-1}$ to $b_0$ at the output 1515 of the SAR ADC 1510. The SAR 1540 may also output zero for each of the higher-order bits $b_{n-1}$ to $b_m$ and output the sign bit $b_{sign}$.

If the control signal indicates the difference between the first input voltage Vinp and the second input voltage Vinn is greater than the first threshold voltage, then the SAR 1540 compares the difference between the first input voltage Vinp and the second input voltage Vinn with the second threshold voltage. To do this, the SAR 1140 causes the switching circuit 1555*a* to couple the second terminal 1724*a* of the fifth capacitor 1720*a* to the second voltage V2 so that the second terminals 1574*a* and 1724*a* of the first and fifth capacitors 1570*a* and 1720*a* are both coupled to the second voltage V2. The second terminals of the other capacitors 1560*a*-1 to 1560*a*-(n−1), 1560*b*-*a* to 1560*b*-(n−1), 1570*b*, 1580*a*, 1580*b*, and 1720*b* are left coupled to the first voltage V1. This causes the output 1554*a* of the first capacitive DAC 1550*a* to be approximately equal to Vinp−Vth2 where Vth2 is the second threshold voltage set by the combined capacitances of the first and fifth capacitors 1570*a* and 1720*a*.

If the control signal indicates the difference between the first input voltage Vinp and the second input voltage Vinn is less than the second threshold voltage, then the SAR 1540 may resolve the last k bits over k conversion cycles where k is greater than m. The last k bit may be resolved in the manner discussed above starting the conversion at bit $b_{k-1}$. After the last k bits $b_{k-1}$ to $b_0$ of the digital signal have been resolved, the SAR 1540 may output the resolved bits $b_{k-1}$ to $b_0$ at the output 1515 of the SAR ADC 1510. The SAR 1540 may also output zero for each of the higher-order bits $b_{n-1}$ to $b_k$ and output the sign bit $b_{sign}$.

If the control signal indicates that the difference between the first input voltage Vinp and the second input voltage Vinn is greater than the second threshold voltage, then the SAR 1540 may resolve all n bits over n conversion cycles in the manner discussed above with reference to FIG. 15. For example, to resolve the MSB bit $b_{n-1}$, the SAR 1140 causes the switching circuit 1555*a* to couple the second terminal 1584*a* of the second capacitor 1580*a* to the second voltage V2 so that the second terminals 1574*a*, 1724*a*, and 1580*a* of the first, second, and fifth capacitors 1570*a*, 1580*a*, and 1720*a* are all coupled to the second voltage V2. The second terminals of the other capacitors 1560*a*-1 to 1560*a*-(n−1), 1560*b*-*a* to 1560*b*-(n−1), 1570*b*, 1580*b*, and 1720*b* are left coupled to the first voltage V1. The SAR 1540 may then resolve the MSB bit $b_{n-1}$ based on the compare signal from the comparator 1530 (e.g., resolve a bit value of one if the compare signal has the first logic value and resolve a bit value of zero if the compare signal has the second logic value). After the n bits $b_{n-1}$ to $b_0$ of the digital signal have been resolved, the SAR 1540 may output the resolved bits $b_{n-1}$ to $b_0$ at the output 1515 of the SAR ADC 1510. The SAR 1540 may also output the sign bit $b_{sign}$.

The exemplary operation discussed above are for the case where the first input voltage Vinp is greater than the second input voltage Vinn. If the second input voltage Vinn is greater than the first input voltage Vinp, then the SAR 1540 may determine whether the difference between the second input voltage Vinn and the first input voltage Vinp is greater than the first threshold voltage in the manner discussed above in which the roles the first capacitive DAC 1550*a* and the second capacitive DAC 1550*b* are reversed.

For example, to compare the difference between the second input voltage Vinn and the first input voltage Vinp with the first threshold voltage, the SAR 1540 causes the switching circuit 1650*a* to couple the second terminal 1574*b* of the third capacitor 1570*b* to the second voltage V2. The second terminals of the other capacitors 1560*a*-1 to 1560*a*-(n−1), 1560*b*-*a* to 1560*b*-(n−1), 1570*a*, 1580*a*, 1580*b*, 1720*a*, and 1720*b* are left coupled to the first voltage V1. This causes the output 1554*b* of the second capacitive DAC 1550*b* to be approximately equal to Vinn−Vth1 where Vth1 is the first threshold voltage set by the capacitance of the first capacitor 1570*b*.

If the control signal indicates the difference between the second input voltage Vinn and the first input voltage Vinp is less than the first threshold voltage, then the SAR 1540 may resolve the last m bits over m conversion cycles, as discussed above with reference to FIG. 15. After the last m bits $b_{m-1}$ to $b_0$ of the digital signal have been resolved, the SAR 1540 may output the resolved bits $b_{m-1}$ to $b_0$ at the output 1515 of the SAR ADC 1510. The SAR 1540 may also output zero for each of the higher-order bits $b_{n-1}$ to $b_m$ and output the sign bit $b_{sign}$.

If the control signal indicates the difference between the second input voltage Vinn and the first input voltage Vinp is greater than the first threshold voltage, then the SAR 1540 compares the difference between the second input voltage Vinn and the first input voltage Vinp with the second threshold voltage. To do this, the SAR 1140 causes the switching circuit 1555*b* to couple the second terminal 1724*b* of the sixth capacitor 1720*b* to the second voltage V2 so that the second terminals 1574*b* and 1724*b* of the third and sixth capacitors 1570*b* and 1720*b* are both coupled to the second voltage V2. The second terminals of the other capacitors 1560*a*-1 to 1560*a*-(n−1), 1560*b*-*a* to 1560*b*-(n−1), 1570*a*, 1580*a*, 1580*b*, and 1720*a* are left coupled to the first voltage V1. This causes the output 1554*b* of the second capacitive DAC 1550*b* to be approximately equal to Vinn−Vth2 where Vth2 is the second threshold voltage set by the combined capacitances of the third and sixth capacitors 1570*b* and 1720*b*.

If the control signal indicates the difference between the second input voltage Vinn and the first input voltage Vinp is less than the second threshold voltage, then the SAR 1540 may resolve the last k bits over k conversion cycles where k is greater than m. After the last k bits $b_{k-1}$ to $b_0$ of the digital signal have been resolved, the SAR 1540 may output the resolved bits $b_{k-1}$ to $b_0$ at the output 1515 of the SAR ADC 1510. The SAR 1540 may also output zero for each of the higher-order bits $b_{n-1}$ to $b_k$ and output the sign bit $b_{sign}$.

If the control signal indicates that the difference between the second input voltage Vinn and the second input voltage Vinp is greater than the second threshold voltage, then the SAR 1540 may resolve all n bits over n conversion cycles in the manner discussed above with reference to FIG. 15. For example, to resolve the MSB bit $b_{n-1}$, the SAR 1140 causes the switching circuit 1555*b* to couple the second terminal 1584*b* of the fourth capacitor 1580*b* to the second voltage V2 so that the second terminals 1574*b*, 1724*b*, and 1580*b* of the third, fourth, and sixth capacitors 1570*b*, 1580*b*, and 1720*b* are all coupled to the second voltage V2. The second terminals of the other capacitors 1560*a*-1 to 1560*a*-(n−1), 1560*b*-a to 1560*b*-(n−1), 1570*a*, 1580*a*, and 1720*a* are left coupled to the first voltage V1. The SAR 1540 may the resolve the MSB bit $b_{n-1}$ based on the compare signal from the comparator 1530 (e.g., resolve a bit value of one if the compare signal has the second logic value and resolve a bit value of zero if the compare signal has the first logic value). After the n bits $b_{n-1}$ to $b_0$ of the digital signal have been resolved, the SAR 1540 may output the resolved bits $b_{n-1}$ to $b_0$ at the output 1515 of the SAR ADC 1510. The SAR 1540 may also output the sign bit $b_{sign}$.

Figure 18:
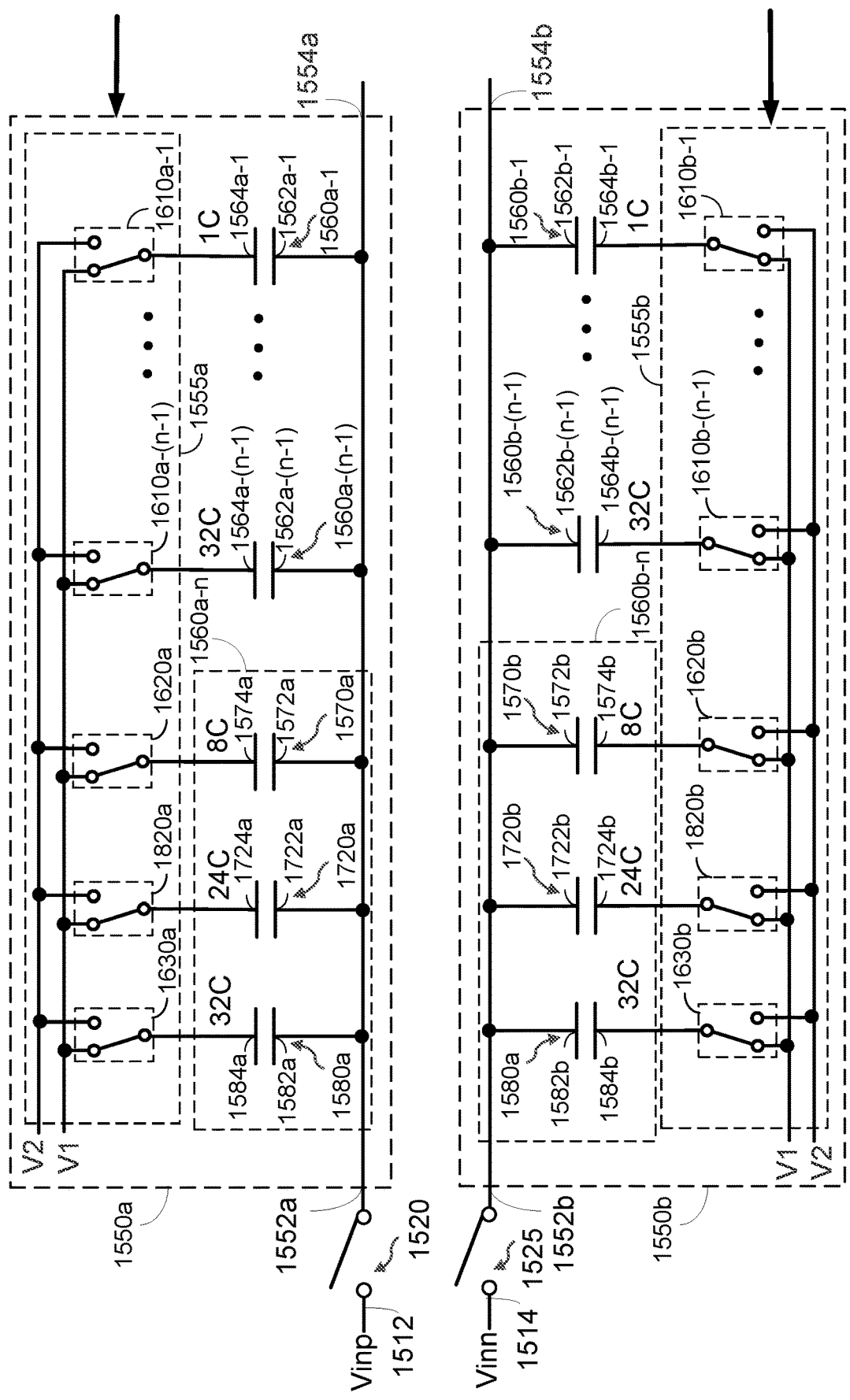
FIG. 18 shows another exemplary implementation of a first switching circuit and a second switching circuit according to certain aspects of the present disclosure.

FIG. 18 shows an exemplary implementation of the switching circuits 1555*a* and 1555*b* according to certain aspects. In this example, the first switching circuit 1555*a* further includes a fifth switch 1820*a* coupled to the second terminal 1724*a* of the fifth capacitor 1720*a*, the first voltage V1, and the second voltage V2. In operation, the fifth switch 1820*a* is configured to receive a fifth control signal from the SAR 1540 and selectively couple the second terminal 1724*a* of the fifth capacitor 1720*a* to the second voltage V2 or the first voltage V1 based on the fifth control signal. For case of illustration, the individual connection between the fifth switch 1820*a* and the SAR 1540 is not explicitly shown in FIG. 18.

Since the first switch 1620*a*, the second switch 1630*a*, and the fifth switch 1820*a* are controlled by separate control signals, the SAR 1540 can independently switch the first capacitor 1570*a*, the second capacitor 1580*a*, and the fifth capacitor 1720*a*. The independent control of the switches 1620*a*, 1630*a*, and 1820*a* allows the SAR 1140 to use the first capacitor 1570*a* to provide the threshold voltage, combine the first capacitor 1570*a* and the fifth capacitor 1720*a* to provide the second threshold voltage, and combine the first capacitor 1570*a*, the second capacitor 1580*a*, and the fifth capacitor 1720*a* to provide the MSB capacitance for resolving the MSB $b_{n-1}$.

In this example, the second switching circuit 1555*b* further includes a sixth switch 1820*b* coupled to the second terminal 1724*b* of the sixth capacitor 1720*b*, the first voltage V1, and the second voltage V2. In operation, the sixth switch 1820*b* is configured to receive a sixth control signal from the SAR 1540 and selectively couple the second terminal 1724*b* of the sixth capacitor 1720*b* to the second voltage V2 or the first voltage V1 based on the sixth control signal. For ease of illustration, the individual connection between the sixth switch 1820*b* and the SAR 1540 is not explicitly shown in FIG. 18.

Since the third switch 1620*b*, the fourth switch 1630*b*, and the sixth switch 1820*b* are controlled by separate control signals, the SAR 1540 can independently switch the third capacitor 1570*b*, the fourth capacitor 1580*b*, and the sixth capacitor 1720*b*. The independent control of the switches 1620*b*, 1630*b*, and 1820*b* allows the SAR 1140 to use the third capacitor 1570*b* to provide the threshold voltage, combine the third capacitor 1570*b* and the sixth capacitor 1720*b* to provide the second threshold voltage, and combine the third capacitor 1570*b*, the fourth capacitor 1580*b*, and the sixth capacitor 1720*b* to provide the MSB capacitance for resolving the MSB $b_{n-1}$.

Implementation examples are described in the following numbered clauses:

1. An analog-to-digital converter (ADC), comprising:
    a comparator having a first input, a second input, and an output;
    a successive approximation register (SAR) coupled to the output of the comparator; and
    a capacitive digital-to-analog converter (DAC) having an input and an output, wherein the input of the capacitor DAC is configured to receive an input voltage, and the output of the capacitive DAC is coupled to the first input of the comparator, the capacitive DAC comprising:
    binary-weighted capacitors, wherein the binary-weighted capacitors include a most significant bit (MSB) capacitor and lower-order capacitors, the MSB capacitor has a largest capacitance among the binary-weighted capacitors, the MSB capacitor comprises a first capacitor and a second capacitor, a first terminal of the first capacitor is coupled to the output of the capacitive DAC, a first terminal of the second capacitor is coupled to the output of the capacitive DAC, and a first terminal of each of the lower-order capacitors is coupled to the output of the capacitive DAC; and
    a switching circuit coupled to the SAR, to a second terminal of the first capacitor, to a second terminal of the second capacitor, and to a second terminal of each of the lower-order capacitors.
2. The ADC of clause 1, wherein the switching circuit comprises:
    a first switch coupled to the second terminal of the first capacitor, wherein the first switch is configured to selectively couple the second terminal of the first capacitor to the input of the capacitive DAC, to a first voltage, or to a second voltage based on a first control signal from the SAR; and
    a second switch coupled to the second terminal of the second capacitor, wherein the second switch is configured to selectively couple the second terminal of the second capacitor to the input of the capacitive DAC, to the first voltage, or to the second voltage based on a second control signal from the SAR.
3. The ADC of clause 2, wherein the second input of the comparator is coupled to a third voltage.
4. The ADC of clause 3, wherein the third voltage is at a ground potential
5. The ADC of any one of clauses 2 to 4, wherein the first voltage is at a ground potential.
6. The ADC of any one of clauses 1 to 5, wherein a sum of a capacitance of the first capacitor and a capacitance of the second capacitor is approximately equal to a sum of capacitances of the lower-order capacitors.

7. The ADC of any one of clauses 1 to 6, wherein the SAR is configured to:
cause the switching circuit to couple the second terminal of the second capacitor to a first voltage, couple the second terminal of the first capacitor to a second voltage, and couple the second terminal of each of the lower-order capacitors to the first voltage; and
determine whether the input voltage is greater than or less than a threshold voltage based on a compare signal from the comparator.

8. The ADC of clause 7, wherein the SAR is configured to:
determine the input voltage is greater than the threshold voltage if the compare signal has a first logic value; and
determine the input voltage is less than the threshold voltage if the compare signal has a second logic value.

9. The ADC of clause 7 or 8, wherein, if the input voltage is greater than the threshold voltage, the SAR is configured to:
cause the switching circuit to couple the second terminal of the first capacitor and the second terminal of the second capacitor to the second voltage, and couple the second terminal of each of the lower-order capacitors to the first voltage; and
resolve a most significant bit of a digital signal based on the compare signal from the comparator.

10. The ADC of clause 9, wherein the SAR is configured:
resolve the most significant bit of the digital signal to a bit value of one if the compare signal has a first logic value; and
resolve the most significant bit of the digital signal to a bit value of zero if the compare signal has a second logic value.

11. The ADC of clause 9 or 10, wherein, if the input voltage is less than the threshold voltage, the SAR is configured to:
for each one of last m bits of the digital signal,
couple the second terminal of a respective one of the lower-order capacitors to the second voltage; and
resolve the one of the last m bits of the digital signal based on the compare signal from the comparator;
wherein m is less than a total number of bits of the digital signal.

12. The ADC of clause 11, wherein the SAR is configured to output the resolved last m bits and output a bit value of zero for each bit of the digital signal having a higher order than the last m bits of the digital signal.

13. The ADC of clause 11 or 12, wherein the SAR is configured to:
for each one of the last m bits of the digital signal,
resolve the one of the m bits to a bit value of one if the compare signal has a first logic value; and
resolve the one of the last m bits to a bit value of zero if the compare signal has a second logic value.

14. The ADC of any one of clauses 1 to 6, wherein the MSB capacitor further comprises a third capacitor, wherein a first terminal of the third capacitor is coupled to the output of the capacitive DAC, and a second terminal of the third capacitor is coupled to the switching circuit.

15. The ADC of clause 14, wherein a sum of a capacitance of the first capacitor, a capacitance of the second capacitor, and a capacitance of the third capacitor is approximately equal to a sum of capacitances of the lower-order capacitors.

16. The ADC of clause 14 or 15, wherein the SAR is configured to:
cause the switching circuit to couple the second terminal of the second capacitor to a first voltage, couple the second terminal of the third capacitor to the first voltage, couple the second terminal of the first capacitor to a second voltage, and couple the second terminal of each of the lower-order capacitors to the first voltage; and
determine whether the input voltage is greater than or less than a first threshold voltage based on a compare signal from the comparator.

17. The ADC of clause 16, wherein the SAR is configured to:
determine the input voltage is greater than the first threshold voltage if the compare signal has a first logic value; and
determine the input voltage is less than the first threshold voltage if the compare signal has a second logic value.

18. The ADC of clause 16 or 17, wherein, if the input voltage is less than the first threshold voltage, the SAR is configured to:
for each one of last m bits of a digital signal,
couple the second terminal of a respective one of the lower-order capacitors to the second voltage; and
resolve the one of the last m bits of the digital signal based on the compare signal from the comparator;
wherein m is less than a total number of bits of the digital signal.

19. The ADC of clause 18, wherein, if the input voltage is greater than the first threshold voltage, the SAR is configured to:
cause the switching circuit to couple the second terminal of the first capacitor and the second terminal of the third capacitor to the second voltage, couple the second terminal of the second capacitor to the first voltage, and couple the second terminal of each of the lower-order capacitors to the first voltage; and
determine whether the input voltage is greater than or less than a second threshold voltage based on the compare signal from the comparator, wherein the second voltage is greater than the first threshold voltage.

20. The ADC of clause 19, wherein, if the input voltage is greater than the second threshold voltage, the SAR is configured to:
cause the switching circuit to couple the second terminal of the first capacitor, the second terminal of the second capacitor, and the second terminal of the third capacitor to the second voltage, and couple the second terminal of each of the lower-order capacitors to the first voltage; and
resolve a most significant bit of a digital signal based on the compare signal from the comparator.

21. The ADC of clause 20, wherein the SAR is configured:
resolve the most significant bit of the digital signal to a bit value of one if the compare signal has a first logic value; and
resolve the most significant bit of the digital signal to a bit value of zero if the compare signal has a second logic value.

22. The ADC of clause 20 or 21, wherein, if the input voltage is less than the second threshold voltage, the SAR is configured to:
for each one of last k bits of the digital signal,
couple the second terminal of a respective one of the lower-order capacitors to the second voltage; and
resolve the one of the last k bits of the digital signal based on the compare signal from the comparator;
wherein k is less than a total number of bits of the digital signal.
23. The ADC of any one of clauses 1 to 22, wherein, during a sampling phase, the SAR is configured to cause the switching circuit to couple the second terminal of the first capacitor, the second terminal of the second capacitor, and the second terminal of each of the lower-order capacitors to the input of the capacitive DAC.
24. The ADC of clause 23, further comprising a switch coupled between the output of the capacitive DAC and a voltage, wherein the switch is closed during the sampling phase.
25. The ADC of clause 24, wherein the voltage is at ground potential.
26. An analog-to-digital converter (ADC), comprising:
a comparator having a first input, a second input, and an output;
a successive approximation register (SAR) coupled to the output of the comparator; and
a first capacitive digital-to-analog converter (DAC) having an input and an output, wherein the input of the first capacitor DAC is configured to receive a first input voltage, and the output of the first capacitive DAC is coupled to the first input of the comparator, the first capacitive DAC comprising:
first binary-weighted capacitors, wherein the first binary-weighted capacitors include a first most significant bit (MSB) capacitor and first lower-order capacitors, the first MSB capacitor has a largest capacitance among the first binary-weighted capacitors, the first MSB capacitor comprises a first capacitor and a second capacitor, a first terminal of the first capacitor is coupled to the output of the first capacitive DAC, a first terminal of the second capacitor is coupled to the output of the first capacitive DAC, and a first terminal of each of the first lower-order capacitors is coupled to the output of the first capacitive DAC; and
a first switching circuit coupled to the SAR, to a second terminal of the first capacitor, to a second terminal of the second capacitor, and to a second terminal of each of the first lower-order capacitors; and
a second DAC having an input and an output, wherein the input of the second capacitor DAC is configured to receive a second input voltage, and the output of the second capacitive DAC is coupled to the second input of the comparator, the second capacitive DAC comprising:
second binary-weighted capacitors, wherein the second binary-weighted capacitors include a second MSB capacitor and second lower-order capacitors, the second MSB capacitor has a largest capacitance among the second binary-weighted capacitors, the second MSB capacitor comprises a third capacitor and a fourth capacitor, a first terminal of the third capacitor is coupled to the output of the second capacitive DAC, a first terminal of the fourth capacitor is coupled to the output of the second capacitive DAC, and a first terminal of each of the second lower-order capacitors is coupled to the output of the second capacitive DAC; and
a second switching circuit coupled to the SAR, to a second terminal of the third capacitor, to a second terminal of the fourth capacitor, and to a second terminal of each of the second lower-order capacitors.
27. The ADC of clause 26, wherein the first switching circuit comprises:
a first switch coupled to the second terminal of the first capacitor, wherein the first switch is configured to selectively couple the second terminal of the first capacitor to a first voltage or to a second voltage based on a first control signal from the SAR; and
a second switch coupled to the second terminal of the second capacitor, wherein the second switch is configured to selectively couple the second terminal of the second capacitor to the first voltage or to the second voltage based on a second control signal from the SAR.
28. The ADC of clause 27, wherein the second switching circuit comprises:
a third switch coupled to the second terminal of the third capacitor, wherein the third switch is configured to selectively couple the second terminal of the third capacitor to the first voltage or to the second voltage based on a third control signal from the SAR; and
a fourth switch coupled to the second terminal of the fourth capacitor, wherein the fourth switch is configured to selectively couple the second terminal of the fourth capacitor to the first voltage or to the second voltage based on a fourth control signal from the SAR.
29. The ADC of any one of clauses 26 to 28, wherein a sum of a capacitance of the first capacitor and a capacitance of the second capacitor is approximately equal to a sum of capacitances of the first lower-order capacitors.
30. The ADC of clause 29, wherein a sum of a capacitance of the third capacitor and a capacitance of the fourth capacitor is approximately equal to a sum of capacitances of the second lower-order capacitors.
31. The ADC of any one of clauses 26 to 30, wherein the SAR is configured to:
cause the first switching circuit to couple the second terminal of the second capacitor and the second terminal of each of the first lower-order capacitors to a first voltage, and couple the second terminal of the first capacitor to a second voltage;
cause the second switching circuit to couple the second terminal of the third capacitor, the second terminal of the fourth capacitor, and the second terminal of each of the second lower-order capacitors to the first voltage; and
determine whether a difference between the first input voltage and the second input voltage is greater than or less than a threshold voltage based on a compare signal from the comparator.
32. The ADC of clause 31, wherein the SAR is configured to:
determine the difference between the first input voltage and the second input voltage is greater than the threshold voltage if the compare signal has a first logic value; and determine the difference between the first input voltage and the second input voltage is less than the threshold voltage if the compare signal has a second logic value.

33. The ADC of clause 31 or 32, wherein, if the difference between the first input voltage and the second input voltage is greater than the threshold voltage, the SAR is configured to:
cause the first switching circuit to couple the second terminal of the first capacitor and the second terminal of the second capacitor to the second voltage, and couple the second terminal of each of the first lower-order capacitors to the first voltage;
cause the second switching circuit to couple the second terminal of the third capacitor, the second terminal of the fourth capacitor, and the second terminal of each of the second lower-order capacitors to the first voltage; and
resolve a most significant bit of a digital signal based on the compare signal from the comparator.

34. The ADC of clause 33, wherein the SAR is configured:
resolve the most significant bit of the digital signal to a bit value of one if the compare signal has a first logic value; and
resolve the most significant bit of the digital signal to a bit value of zero if the compare signal has a second logic value.

35. The ADC of clause 33 or 34, wherein, if the difference between the first input voltage and the second input voltage is less than the threshold voltage, the SAR is configured to:
for each one of last m bits of the digital signal,
couple the second terminal of a respective one of the first lower-order capacitors to the second voltage if a previous resolved bit is one or couple the second terminal of a respective one of the second lower-order capacitors to the second voltage if the previous resolved bit is zero; and
resolve the one of the last m bits of the digital signal based on the compare signal from the comparator;
wherein m is less than a total number of bits of the digital signal.

36. The ADC of clause 35, wherein the SAR is configured to output the resolved m bits and output a bit value of zero for each bit of the digital signal having a higher order than the m bits of the digital signal.

37. The ADC of clause 35 or 36, wherein the SAR is configured to:
for each one of the last m bits of the digital signal,
resolve the one of the last m bits to a bit value of one if the compare signal has a first logic value; and
resolve the one of the last m bits to a bit value of zero if the compare signal has a second logic value.

38. The ADC of any one of clauses 26 to 30, wherein the first MSB capacitor further comprises a fifth capacitor, wherein a first terminal of the fifth capacitor is coupled to the output of the first capacitive DAC, and a second terminal of the fifth capacitor is coupled to the first switching circuit.

39. The ADC of clause 38, wherein a sum of a capacitance of the first capacitor, a capacitance of the second capacitor, and a capacitance of the fifth capacitor is approximately equal to a sum of capacitances of the first lower-order capacitors.

40. The ADC of clause 38 or 39, wherein the second MSB capacitor further comprises a sixth capacitor, wherein a first terminal of the sixth capacitor is coupled to the output of the second capacitive DAC, and a second terminal of the sixth capacitor is coupled to the second switching circuit.

41. The ADC of clause 40, wherein:
a sum of a capacitance of the first capacitor, a capacitance of the second capacitor, and a capacitance of the fifth capacitor is approximately equal to a sum of capacitances of the first lower-order capacitors; and
a sum of a capacitance of the third capacitor, a capacitance of the fourth capacitor, and a capacitance of the sixth capacitor is approximately equal to a sum of capacitances of the second lower-order capacitors.

42. An analog-to-digital converter (ADC), comprising:
a comparator having a first input, a second input, and an output;
a successive approximation register (SAR) coupled to the output of the comparator; and
a capacitive digital-to-analog converter (DAC) having an input and an output, wherein the input of the capacitor DAC is configured to receive an input voltage, and the output of the capacitive DAC is coupled to the first input of the comparator, the capacitive DAC comprising:
a plurality of binary-weighted capacitors comprising a most significant bit (MSB) capacitor and lower-order capacitors, wherein the MSB capacitor has a largest capacitance among the plurality of binary-weighted capacitors, the MSB capacitor comprises a first capacitor and a second capacitor, a first terminal of the first capacitor and a first terminal of the second capacitor are coupled to the output of the capacitive DAC, and a first terminal of each of the lower-order capacitors is coupled to the output of the capacitive DAC; and
a switching circuit coupled to the SAR, to a second terminal of the first capacitor, to a second terminal of the second capacitor, and to a second terminal of each of the lower-order capacitors.

43. An analog-to-digital converter (ADC), comprising:
a comparator having a first input, a second input, and an output;
a successive approximation register (SAR) coupled to the output of the comparator; and
a first capacitive digital-to-analog converter (DAC) having an input and an output, wherein the input of the first capacitor DAC is configured to receive a first input voltage, and the output of the first capacitive DAC is coupled to the first input of the comparator, the first capacitive DAC comprising:
a first plurality of binary-weighted capacitors comprising a first most significant bit (MSB) capacitor and first lower-order capacitors, wherein the first MSB capacitor has a largest capacitance among the first plurality of binary-weighted capacitors, the first MSB capacitor comprises a first capacitor and a second capacitor, a first terminal of the first capacitor and a first terminal of the second capacitor are coupled to the output of the first capacitive DAC, and a first terminal of each of the first lower-order capacitors is coupled to the output of the first capacitive DAC; and
a first switching circuit coupled to the SAR, to a second terminal of the first capacitor, to a second terminal of the second capacitor, and to a second terminal of each of the first lower-order capacitors; and a second DAC having an input and an output, wherein the input of the second capacitor DAC is configured to receive a second input voltage, and the output of the second capacitive DAC is coupled to the second input of the comparator, the second capacitive DAC comprising:
a second plurality of binary-weighted capacitors comprising a second MSB capacitor and second lower-order capacitors, wherein the second MSB capacitor has a largest capacitance among the second plurality of binary-weighted capacitors, the second MSB capacitor comprises a third capacitor and a fourth capacitor, a first terminal of the third capacitor and a first terminal of the fourth capacitor are coupled to the output of the second capacitive DAC, and a first terminal of each of the second lower-order capacitors is coupled to the output of the second capacitive DAC; and
a second switching circuit coupled to the SAR, to a second terminal of the third capacitor, to a second terminal of the fourth capacitor, and to a second terminal of each of the second lower-order capacitors.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An analog-to-digital converter (ADC), comprising:
a comparator having a first input, a second input, and an output;
a successive approximation register (SAR) coupled to the output of the comparator; and
a capacitive digital-to-analog converter (DAC) having an input and an output, wherein the input of the capacitor DAC is configured to receive an input voltage, and the output of the capacitive DAC is coupled to the first input of the comparator, the capacitive DAC comprising:
binary-weighted capacitors, wherein the binary-weighted capacitors include a most significant bit (MSB) capacitor and lower-order capacitors, the MSB capacitor has a largest capacitance among the binary-weighted capacitors, the MSB capacitor comprises a first capacitor and a second capacitor, a first terminal of the first capacitor is coupled to the output of the capacitive DAC, a first terminal of the second capacitor is coupled to the output of the capacitive DAC, and a first terminal of each of the lower-order capacitors is coupled to the output of the capacitive DAC; and
a switching circuit coupled to the SAR, to a second terminal of the first capacitor, to a second terminal of the second capacitor, and to a second terminal of each of the lower-order capacitors;
wherein the SAR is configured to:
cause the switching circuit to couple the second terminal of the second capacitor to a first voltage, couple the second terminal of the first capacitor to a second voltage, and couple the second terminal of each of the lower-order capacitors to the first voltage; and
determine whether the input voltage is greater than or less than a threshold voltage based on a compare signal from the comparator; and
wherein, if the input voltage is less than the threshold voltage, the SAR is further configured to:
cause the switching circuit to couple the second terminal of the first capacitor and the second terminal of the second capacitor to the second voltage, and couple the second terminal of each of the lower-order capacitors to the first voltage; and
resolve a most significant bit of a digital signal based on the compare signal from the comparator.

2. The ADC of claim 1, wherein the switching circuit comprises:
a first switch coupled to the second terminal of the first capacitor, wherein the first switch is configured to selectively couple the second terminal of the first capacitor to the input of the capacitive DAC, to a first voltage, or to a second voltage based on a first control signal from the SAR; and
a second switch coupled to the second terminal of the second capacitor, wherein the second switch is configured to selectively couple the second terminal of the second capacitor to the input of the capacitive DAC, to the first voltage, or to the second voltage based on a second control signal from the SAR.

3. The ADC of claim 2, wherein the second input of the comparator is coupled to a third voltage.

4. The ADC of claim 3, wherein the third voltage is at a ground potential.

5. The ADC of claim 2, wherein the first voltage is at a ground potential.

6. The ADC of claim 1, wherein a sum of a capacitance of the first capacitor and a capacitance of the second capacitor is approximately equal to a sum of capacitances of the lower-order capacitors.

7. The ADC of claim 1, wherein the SAR is configured to:
determine the input voltage is greater than the threshold voltage if the compare signal has a first logic value; and
determine the input voltage is less than the threshold voltage if the compare signal has a second logic value.

8. The ADC of claim 1, wherein the SAR is configured:
resolve the most significant bit of the digital signal to a bit value of one if the compare signal has a first logic value; and
resolve the most significant bit of the digital signal to a bit value of zero if the compare signal has a second logic value.

9. The ADC of claim 1, wherein, if the input voltage is less than the threshold voltage, the SAR is configured to:
for each one of last m bits of the digital signal,
couple the second terminal of a respective one of the lower-order capacitors to the second voltage; and
resolve the one of the last m bits of the digital signal based on the compare signal from the comparator;
wherein m is less than a total number of bits of the digital signal.

10. The ADC of claim 9, wherein the SAR is configured to output the resolved last m bits and output a bit value of zero for each bit of the digital signal having a higher order than the last m bits of the digital signal.

11. The ADC of claim 9, wherein the SAR is configured to:
for each one of the last m bits of the digital signal,
resolve the one of the m bits to a bit value of one if the compare signal has a first logic value; and
resolve the one of the last m bits to a bit value of zero if the compare signal has a second logic value.

12. The ADC of claim 1, wherein the MSB capacitor further comprises a third capacitor, wherein a first terminal of the third capacitor is coupled to the output of the capacitive DAC, and a second terminal of the third capacitor is coupled to the switching circuit.

13. The ADC of claim 12, wherein a sum of a capacitance of the first capacitor, a capacitance of the second capacitor, and a capacitance of the third capacitor is approximately equal to a sum of capacitances of the lower-order capacitors.

14. The ADC of claim 12, wherein the SAR is configured to:
cause the switching circuit to couple the second terminal of the second capacitor to a first voltage, couple the second terminal of the third capacitor to the first voltage, couple the second terminal of the first capacitor to a second voltage, and couple the second terminal of each of the lower-order capacitors to the first voltage; and
determine whether the input voltage is greater than or less than a first threshold voltage based on a compare signal from the comparator.

15. The ADC of claim 14, wherein the SAR is configured to:
determine the input voltage is greater than the first threshold voltage if the compare signal has a first logic value; and
determine the input voltage is less than the first threshold voltage if the compare signal has a second logic value.

16. The ADC of claim 14, wherein, if the input voltage is less than the first threshold voltage, the SAR is configured to:
for each one of last m bits of a digital signal,
couple the second terminal of a respective one of the lower-order capacitors to the second voltage; and
resolve the one of the last m bits of the digital signal based on the compare signal from the comparator;
wherein m is less than a total number of bits of the digital signal.

17. The ADC of claim 16, wherein, if the input voltage is greater than the first threshold voltage, the SAR is configured to:
cause the switching circuit to couple the second terminal of the first capacitor and the second terminal of the third capacitor to the second voltage, couple the second terminal of the second capacitor to the first voltage, and couple the second terminal of each of the lower-order capacitors to the first voltage; and
determine whether the input voltage is greater than or less than a second threshold voltage based on the compare signal from the comparator, wherein the second voltage is greater than the first threshold voltage.

18. The ADC of claim 17, wherein, if the input voltage is greater than the second threshold voltage, the SAR is configured to:
cause the switching circuit to couple the second terminal of the first capacitor, the second terminal of the second capacitor, and the second terminal of the third capacitor to the second voltage, and couple the second terminal of each of the lower-order capacitors to the first voltage; and
resolve a most significant bit of a digital signal based on the compare signal from the comparator.

19. The ADC of claim 18, wherein the SAR is configured:
resolve the most significant bit of the digital signal to a bit value of one if the compare signal has a first logic value; and
resolve the most significant bit of the digital signal to a bit value of zero if the compare signal has a second logic value.

20. The ADC of claim 18, wherein, if the input voltage is less than the second threshold voltage, the SAR is configured to:
for each one of last k bits of the digital signal,
couple the second terminal of a respective one of the lower-order capacitors to the second voltage; and
resolve the one of the last k bits of the digital signal based on the compare signal from the comparator;
wherein k is less than a total number of bits of the digital signal.

21. The ADC of claim 1, wherein, during a sampling phase, the SAR is configured to cause the switching circuit to couple the second terminal of the first capacitor, the second terminal of the second capacitor, and the second terminal of each of the lower-order capacitors to the input of the capacitive DAC.

22. The ADC of claim 21, further comprising a switch coupled between the output of the capacitive DAC and a voltage, wherein the switch is closed during the sampling phase.

23. The ADC of claim 22, wherein the voltage is at ground potential.

24. An analog-to-digital converter (ADC), comprising:
a comparator having a first input, a second input, and an output;
a successive approximation register (SAR) coupled to the output of the comparator; and
a first capacitive digital-to-analog converter (DAC) having an input and an output, wherein the input of the first capacitor DAC is configured to receive a first input voltage, and the output of the first capacitive DAC is coupled to the first input of the comparator, the first capacitive DAC comprising:
first binary-weighted capacitors, wherein the first binary-weighted capacitors include a first most significant bit (MSB) capacitor and first lower-order capacitors, the first MSB capacitor has a largest capacitance among the first binary-weighted capacitors, the first MSB capacitor comprises a first capacitor and a second capacitor, a first terminal of the first capacitor is coupled to the output of the first capacitive DAC, a first terminal of the second capacitor is coupled to the output of the first capacitive DAC, and a first terminal of each of the first lower-order capacitors is coupled to the output of the first capacitive DAC; and a first switching circuit coupled to the SAR, to a second terminal of the first capacitor, to a second terminal of the second capacitor, and to a second terminal of each of the first lower-order capacitors; and a second DAC having an input and an output, wherein the input of the second capacitor DAC is configured to receive a second input voltage, and the output of the second capacitive DAC is coupled to the second input of the comparator, the second capacitive DAC comprising:

second binary-weighted capacitors, wherein the second binary-weighted capacitors include a second MSB capacitor and second lower-order capacitors, the second MSB capacitor has a largest capacitance among the second binary-weighted capacitors, the second MSB capacitor comprises a third capacitor and a fourth capacitor, a first terminal of the third capacitor is coupled to the output of the second capacitive DAC, a first terminal of the fourth capacitor is coupled to the output of the second capacitive DAC, and a first terminal of each of the second lower-order capacitors is coupled to the output of the second capacitive DAC; and a second switching circuit coupled to the SAR, to a second terminal of the third capacitor, to a second terminal of the fourth capacitor, and to a second terminal of each of the second lower-order capacitors;

wherein the SAR is configured to:
cause the first switching circuit to couple the second terminal of the second capacitor and the second terminal of each of the first lower-order capacitors to a first voltage, and couple the second terminal of the first capacitor to a second voltage;

cause the second switching circuit to couple the second terminal of the third capacitor, the second terminal of the fourth capacitor, and the second terminal of each of the second lower-order capacitors to the first voltage; and determine whether a difference between the first input voltage and the second input voltage is greater than or less than a threshold voltage based on a compare signal from the comparator.

25. The ADC of claim 24, wherein the first switching circuit comprises:
a first switch coupled to the second terminal of the first capacitor, wherein the first switch is configured to selectively couple the second terminal of the first capacitor to a first voltage or to a second voltage based on a first control signal from the SAR; and
a second switch coupled to the second terminal of the second capacitor, wherein the second switch is configured to selectively couple the second terminal of the second capacitor to the first voltage or to the second voltage based on a second control signal from the SAR.

26. The ADC of claim 25, wherein the second switching circuit comprises:
a third switch coupled to the second terminal of the third capacitor, wherein the third switch is configured to selectively couple the second terminal of the third capacitor to the first voltage or to the second voltage based on a third control signal from the SAR; and
a fourth switch coupled to the second terminal of the fourth capacitor, wherein the fourth switch is configured to selectively couple the second terminal of the fourth capacitor to the first voltage or to the second voltage based on a fourth control signal from the SAR.

27. The ADC of claim 24, wherein a sum of a capacitance of the first capacitor and a capacitance of the second capacitor is approximately equal to a sum of capacitances of the first lower-order capacitors.

28. The ADC of claim 27, wherein a sum of a capacitance of the third capacitor and a capacitance of the fourth capacitor is approximately equal to a sum of capacitances of the second lower-order capacitors.

29. The ADC of claim 24, wherein the SAR is configured to:
determine the difference between the first input voltage and the second input voltage is greater than the threshold voltage if the compare signal has a first logic value; and
determine the difference between the first input voltage and the second input voltage is less than the threshold voltage if the compare signal has a second logic value.

30. The ADC of claim 24, wherein, if the difference between the first input voltage and the second input voltage is greater than the threshold voltage, the SAR is configured to:
cause the first switching circuit to couple the second terminal of the first capacitor and the second terminal of the second capacitor to the second voltage, and couple the second terminal of each of the first lower-order capacitors to the first voltage;
cause the second switching circuit to couple the second terminal of the third capacitor, the second terminal of the fourth capacitor, and the second terminal of each of the second lower-order capacitors to the first voltage; and
resolve a most significant bit of a digital signal based on the compare signal from the comparator.

31. The ADC of claim 30, wherein the SAR is configured:
resolve the most significant bit of the digital signal to a bit value of one if the compare signal has a first logic value; and
resolve the most significant bit of the digital signal to a bit value of zero if the compare signal has a second logic value.

32. The ADC of claim 30, wherein, if the difference between the first input voltage and the second input voltage is less than the threshold voltage, the SAR is configured to:
for each one of last m bits of the digital signal,
couple the second terminal of a respective one of the first lower-order capacitors to the second voltage if a previous resolved bit is one or couple the second terminal of a respective one of the second lower-order capacitors to the second voltage if the previous resolved bit is zero; and
resolve the one of the last m bits of the digital signal based on the compare signal from the comparator;
wherein m is less than a total number of bits of the digital signal.

33. The ADC of claim 32, wherein the SAR is configured to output the resolved m bits and output a bit value of zero for each bit of the digital signal having a higher order than the m bits of the digital signal.

34. The ADC of claim 32, wherein the SAR is configured to:
for each one of the last m bits of the digital signal,
resolve the one of the last m bits to a bit value of one if the compare signal has a first logic value; and resolve the one of the last m bits to a bit value of zero if the compare signal has a second logic value.

35. The ADC of claim 24, wherein the first MSB capacitor further comprises a fifth capacitor, wherein a first terminal of the fifth capacitor is coupled to the output of the first capacitive DAC, and a second terminal of the fifth capacitor is coupled to the first switching circuit.

36. The ADC of claim 35, wherein a sum of a capacitance of the first capacitor, a capacitance of the second capacitor, and a capacitance of the fifth capacitor is approximately equal to a sum of capacitances of the first lower-order capacitors.

37. The ADC of claim 35, wherein the second MSB capacitor further comprises a sixth capacitor, wherein a first terminal of the sixth capacitor is coupled to the output of the second capacitive DAC, and a second terminal of the sixth capacitor is coupled to the second switching circuit.

38. The ADC of claim 37, wherein:
   a sum of a capacitance of the first capacitor, a capacitance of the second capacitor, and a capacitance of the fifth capacitor is approximately equal to a sum of capacitances of the first lower-order capacitors; and
   a sum of a capacitance of the third capacitor, a capacitance of the fourth capacitor, and a capacitance of the sixth capacitor is approximately equal to a sum of capacitances of the second lower-order capacitors.

\* \* \* \* \*